United States Patent
Keeth et al.

(10) Patent No.: US 11,989,141 B2
(45) Date of Patent: May 21, 2024

(54) NEUROMORPHIC MEMORY DEVICE AND METHOD

(71) Applicant: Micron Technology, Inc., Boise, ID (US)

(72) Inventors: Brent Keeth, Boise, ID (US); Frank F Ross, Boise, ID (US); Richard C Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/131,217

(22) Filed: Dec. 22, 2020

(65) Prior Publication Data

US 2021/0200699 A1    Jul. 1, 2021

Related U.S. Application Data

(60) Provisional application No. 62/954,186, filed on Dec. 27, 2019.

(51) Int. Cl.
| | |
|---|---|
| *G06F 13/16* | (2006.01) |
| *G06N 3/004* | (2023.01) |
| *H01L 25/065* | (2023.01) |
| *H01L 25/18* | (2023.01) |

(52) U.S. Cl.
CPC ......... *G06F 13/1668* (2013.01); *G06N 3/004* (2013.01); *H01L 25/0652* (2013.01); *H01L 25/0657* (2013.01); *H01L 25/18* (2013.01); *H01L 2225/06506* (2013.01); *H01L 2225/0651* (2013.01); *H01L 2225/06541* (2013.01); *H01L 2225/06562* (2013.01)

(58) Field of Classification Search
CPC ..... G06F 13/1668; G04N 3/004; H01L 25/18; H01L 25/0652; H01L 25/0657
See application file for complete search history.

(56) References Cited

U.S. PATENT DOCUMENTS

| | | |
|---|---|---|
| 6,226,738 B1 | 5/2001 | Dowling |
| 6,460,152 B1 | 10/2002 | Demidov et al. |
| 7,640,386 B2 | 12/2009 | Coteus et al. |
| 7,717,752 B2 | 5/2010 | Loughner et al. |

(Continued)

FOREIGN PATENT DOCUMENTS

| | | |
|---|---|---|
| CN | 104471649 B | 6/2017 |
| CN | 113728383 A | 11/2021 |

(Continued)

OTHER PUBLICATIONS

"International Application Serial No. PCT/US2020/067447, International Search Report dated Apr. 27, 2021", 3 pgs.

(Continued)

*Primary Examiner* — Henry Tsai
*Assistant Examiner* — Christopher A Daley
(74) *Attorney, Agent, or Firm* — Schwegman Lundberg & Woessner, P.A.

(57) ABSTRACT

Apparatus and methods are disclosed, including memory devices and systems. Example memory devices, systems and methods include a stack of memory dies, a controller die, and a buffer. Example memory devices, systems and methods include one or more neuromorphic layers logically coupled between one or more dies in the stack of memory dies and a host interface of the controller die.

25 Claims, 11 Drawing Sheets

(56) References Cited

U.S. PATENT DOCUMENTS

| | | | |
|---|---|---|---|
| 8,069,379 B2 | 11/2011 | Perego et al. | |
| 8,275,936 B1 | 9/2012 | Haywood et al. | |
| 8,543,758 B2 | 9/2013 | Larson et al. | |
| 8,754,533 B2 | 6/2014 | Or-bach et al. | |
| 8,984,189 B2 | 3/2015 | Casper et al. | |
| 9,357,649 B2 | 5/2016 | Chun et al. | |
| 9,378,707 B2 | 6/2016 | Lee | |
| 9,391,048 B2 | 7/2016 | Lee | |
| 9,489,009 B2 | 11/2016 | Lee et al. | |
| 9,519,315 B2 | 12/2016 | Connolly | |
| 9,558,805 B2 | 1/2017 | Kang et al. | |
| 10,528,267 B2 | 1/2020 | Batra et al. | |
| 10,621,043 B2 | 4/2020 | Casper et al. | |
| 10,628,295 B2 | 4/2020 | Gu et al. | |
| 10,649,680 B2 | 5/2020 | Riley et al. | |
| 10,733,500 B2* | 8/2020 | Andreopoulos | G06N 3/0445 |
| 10,740,033 B2 | 8/2020 | Kim et al. | |
| 10,797,020 B2* | 10/2020 | Thurgood | H01L 25/0652 |
| 10,877,857 B2 | 12/2020 | Park | |
| 10,922,607 B2* | 2/2021 | Sengupta | G06N 3/049 |
| 11,386,004 B2 | 7/2022 | Keeth et al. | |
| 11,538,508 B2 | 12/2022 | Gibbons et al. | |
| 11,635,910 B2 | 4/2023 | Keeth | |
| 2004/0163028 A1 | 8/2004 | Olarig | |
| 2004/0233721 A1 | 11/2004 | Kim et al. | |
| 2004/0260957 A1 | 12/2004 | Jeddeloh et al. | |
| 2006/0107186 A1 | 5/2006 | Cowell et al. | |
| 2006/0126369 A1 | 6/2006 | Raghuram | |
| 2006/0233012 A1 | 10/2006 | Sekiguchi et al. | |
| 2008/0080261 A1 | 4/2008 | Shaeffer et al. | |
| 2008/0109597 A1 | 5/2008 | Schakel et al. | |
| 2008/0123459 A1 | 5/2008 | Rajan et al. | |
| 2008/0126690 A1 | 5/2008 | Rajan et al. | |
| 2008/0136002 A1 | 6/2008 | Yang | |
| 2008/0253199 A1 | 10/2008 | Torabi et al. | |
| 2009/0021874 A1* | 1/2009 | Divito | H02H 3/023 361/57 |
| 2009/0103345 A1 | 4/2009 | Mclaren et al. | |
| 2009/0248969 A1 | 10/2009 | Wu et al. | |
| 2010/0091537 A1 | 4/2010 | Best et al. | |
| 2010/0195363 A1 | 8/2010 | Norman | |
| 2010/0309706 A1 | 12/2010 | Saito et al. | |
| 2012/0051152 A1 | 3/2012 | Hollis | |
| 2012/0069034 A1 | 3/2012 | Biswas et al. | |
| 2012/0102292 A1 | 4/2012 | Rajan et al. | |
| 2012/0284436 A1* | 11/2012 | Casper | G11C 5/02 710/74 |
| 2012/0311231 A1 | 12/2012 | Porterfield | |
| 2014/0063887 A1 | 3/2014 | Vogelsang | |
| 2014/0173238 A1 | 6/2014 | Perego et al. | |
| 2014/0192583 A1 | 7/2014 | Rajan et al. | |
| 2014/0252656 A1 | 9/2014 | Lee | |
| 2014/0254245 A1 | 9/2014 | Tadepalli et al. | |
| 2015/0155876 A1 | 6/2015 | Jayasena et al. | |
| 2015/0355965 A1 | 12/2015 | Peddle | |
| 2016/0284424 A1 | 9/2016 | Das et al. | |
| 2016/0329303 A1 | 11/2016 | Ye et al. | |
| 2017/0147432 A1 | 5/2017 | Suh et al. | |
| 2017/0194962 A1 | 7/2017 | Bains et al. | |
| 2017/0255552 A1 | 9/2017 | Chatterjee et al. | |
| 2017/0323875 A1 | 11/2017 | Tam | |
| 2017/0344051 A1 | 11/2017 | Patel | |
| 2018/0068217 A1* | 3/2018 | Eleftheriou | G06N 3/0635 |
| 2018/0102344 A1 | 4/2018 | Ramachandra et al. | |
| 2018/0174996 A1 | 6/2018 | Mostovoy et al. | |
| 2018/0225235 A1 | 8/2018 | Lee | |
| 2018/0309451 A1* | 10/2018 | Lu | H04Q 3/0004 |
| 2019/0146788 A1 | 5/2019 | Kim | |
| 2019/0171359 A1 | 6/2019 | Lee et al. | |
| 2019/0171520 A1 | 6/2019 | Cadigan et al. | |
| 2019/0318230 A1 | 10/2019 | Cho et al. | |
| 2020/0143229 A1* | 5/2020 | Van Der Made | G06N 3/088 |
| 2020/0151550 A1* | 5/2020 | Garbin | G06N 3/063 |
| 2020/0235050 A1* | 7/2020 | Lee | H01L 23/53209 |
| 2020/0250516 A1* | 8/2020 | Li | H01L 27/2463 |
| 2020/0272560 A1 | 8/2020 | Keeth et al. | |
| 2020/0272564 A1 | 8/2020 | Keeth et al. | |
| 2020/0279588 A1 | 9/2020 | Lym et al. | |
| 2021/0073616 A1* | 3/2021 | Moraitis | G06N 3/049 |
| 2021/0125045 A1* | 4/2021 | Jang | G06N 3/049 |
| 2021/0132856 A1 | 5/2021 | Chen | |
| 2021/0181974 A1 | 6/2021 | Ghosh | |
| 2021/0200464 A1 | 7/2021 | Keeth | |
| 2021/0201966 A1 | 7/2021 | Gibbons et al. | |
| 2021/0318956 A1 | 10/2021 | Keeth et al. | |
| 2021/0406660 A1* | 12/2021 | Chen | G06N 3/0454 |
| 2022/0121393 A1 | 4/2022 | Keeth | |
| 2022/0342814 A1 | 10/2022 | Keeth et al. | |
| 2023/0127970 A1 | 4/2023 | Gibbons et al. | |
| 2023/0376235 A1 | 11/2023 | Keeth | |

FOREIGN PATENT DOCUMENTS

| | | |
|---|---|---|
| CN | 113767435 A | 12/2021 |
| CN | 114902332 A | 8/2022 |
| CN | 114930452 A | 8/2022 |
| CN | 115398448 A | 11/2022 |
| DE | 102019134293 A1 | 7/2020 |
| JP | 2016522495 | 7/2016 |
| KR | 100988388 | 10/2010 |
| KR | 20160143988 A | 12/2016 |
| KR | 20170029074 A | 3/2017 |
| WO | WO-2020172551 A1 | 8/2020 |
| WO | WO-2020172557 A1 | 8/2020 |
| WO | WO-2021133826 A1 | 7/2021 |
| WO | WO-2021138329 A1 | 7/2021 |
| WO | WO-2021138408 A1 | 7/2021 |
| WO | WO-2022087142 A1 | 4/2022 |

OTHER PUBLICATIONS

"International Application Serial No. PCT/US2020/067447, Written Opinion dated Apr. 27, 2021", 4 pgs.

"International Application Serial No. PCT/US2020/019259, International Preliminary Report on Patentability dated Sep. 2, 2021", 8 pgs.

"International Application Serial No. PCT/US2020/019269, International Preliminary Report on Patentability dated Sep. 2, 2021", 9 pgs.

U.S. Appl. No. 16/797,618, filed Feb. 21, 2020, Memory Device Interface and Method.

U.S. Appl. No. 16/797,571, filed Feb. 21, 2020, Memory Device Interface and Method.

U.S. Appl. No. 17/136,728, filed Dec. 29, 2020, Memory Device Interface and Method.

U.S. Appl. No. 17/137,975, filed Dec. 30, 2020, Memory Module Mutiple Port Buffer Techniques.

U.S. Appl. No. 17/356,906, filed Jun. 24, 2021, Memory Device Interface and Method.

U.S. Appl. No. 16/797,571, Final Office Action dated Jun. 11, 2021, 15 pgs.

U.S. Appl. No. 16/797,618, Response filed May 25, 2021 to Non Final Office Action dated Feb. 25, 2021, pgs.

U.S. Appl. No. 16/797,618, Notice of Allowance dated Jul. 9, 2021, 10 pgs.

"International Application Serial No. PCT/US2020/019259, International Search Report dated Jun. 19, 2020", 6 pgs.

"International Application Serial No. PCT/US2020/019259, Written Opinion dated Jun. 19, 2020", 6 pgs.

"International Application Serial No. PCT/US2020/019269, International Search Report dated Jun. 18, 2020", 4 pgs.

"International Application Serial No. PCT/US2020/019269, Written Opinion dated Jun. 18, 2020", 7 pgs.

"International Application Serial No. PCT/US2020/067319, International Search Report dated Apr. 19, 2021", 4 pgs.

"International Application Serial No. PCT/US2020/067319, Written Opinion dated Apr. 19, 2021", 4 pgs.

"International Application Serial No. PCT US2020 066664, International Search Report dated Apr. 8, 2021", 4 pgs.

(56) References Cited

OTHER PUBLICATIONS

"International Application Serial No. PCT US2020 066664, Written Opinion dated Apr. 8, 2021", 3 pgs.
U.S. Appl. No. 17/506,405, filed Oct. 20, 2021, Buffer Management of Memory Refresh.
"Chinese Application Serial No. 202080030311.6, Office Action dated Aug. 26, 2022", W/ English Translation, 5 pgs.
"International Application Serial No. PCT/US2020/066664, International Preliminary Report on Patentability dated Jul. 7, 2022", 5 pgs.
"International Application Serial No. PCT/US2020/067319, International Preliminary Report on Patentability dated Jul. 14, 2022", 6 pgs.
"International Application Serial No. PCT/US2020/067447, International Preliminary Report on Patentability dated Jul. 14, 2022", 6 pgs.
"Chinese Application Serial No. , Voluntary Amendment filed Mar. 21, 2022", w/English Claims, 16 pgs.
"Chinese Application Serial No. 202080030315.4, Voluntary Amendment filed Mar. 25, 2022", w/English Claims, 14 pgs.
"European Application Serial No. 20758657.9, Response Filed Apr. 11, 2022 to Communication Pursuant to Rules 161(2) and 162 EPC dated Oct. 1, 2021", 9 pgs.
"European Application Serial No. 20759297.3, Response Filed Apr. 19, 2022 to Communication Pursuant to Rules 161(2) and 162 EPC dated Oct. 5, 2021", 9 pgs.
"International Application Serial No. PCT/US2021/055866, International Search Report dated Feb. 4, 2022", 4 pgs.
"International Application Serial No. PCT/US2021/055866, Written Opinion dated Feb. 4, 2022", 4 pgs.
"European Application Serial No. 20758657.9, Extended European Search Report dated Sep. 22, 2022", 8 pgs.
"European Application Serial No. 20759297.3, Extended European Search Report dated Nov. 2, 2022", 9 pgs.
"European Application Serial No. 20909806.0, Extended European Search Report dated May 4, 2023", 12 pgs.
"International Application Serial No. PCT/US2021/055866, International Preliminary Report on Patentability dated May 4, 2023", 6 pgs.
"Korean Application Serial No. 10-2021-7030514, Notice of Preliminary Rejection dated Nov. 10, 2023", with English translation, 15 pages.
U.S. Appl. No. 17/136,728, 312 Amendment filed Mar. 9, 2023, 6 pages.
U.S. Appl. No. 17/356,906, Response filed Feb. 17, 2023 to Non Final Office Action mailed Nov. 17, 2022, 8 pages.
U.S. Appl. No. 17/356,906, Notice of Allowance mailed Mar. 1, 2023, 9 pages.
U.S. Appl. No. 17/506,405, Non Final Office Action mailed Mar. 10, 2023, 28 pages.
U.S. Appl. No. 16/797,571, Notice of Allowance mailed Feb. 18, 2022, 9 pgs.
U.S. Appl. No. 16/797,571, 312 Amendment filed Mar. 7, 2022, 3 pgs.
U.S. Appl. No. 16/797,571, PTO Response to Rule 312 Communication mailed Mar. 11, 2022, 2 pgs.
U.S. Appl. No. 16/797,571, Supplemental Notice of Allowability mailed May 11, 2022, 2 pgs.
U.S. Appl. No. 16/797,618, Notice of Allowance mailed Mar. 9, 2022, 11 pgs.
U.S. Appl. No. 17/136,728, Non Final Office Action mailed May 13, 2022, 13 pgs.
U.S. Appl. No. 17/137,975, Response filed Dec. 20, 2021 to Ex Parte Quayle Action mailed Aug. 18, 2021, 11 pgs.
U.S. Appl. No. 17/137,975, Notice of Allowance mailed Jan. 21, 2022, 8 pgs.
U.S. Appl. No. 17/137,975, Notice of Allowance mailed Apr. 29, 2022, 7 pgs.
"Chinese Application Serial No. 202080030311.6, Response filed Jan. 5, 2023 to Office Action mailed Aug. 26, 2022", with English claims, 13 pages.
"European Application Serial No. 20905242.2, Extended European Search Report mailed Mar. 3, 2023", 10 pgs.
"European Application Serial No. 20909806.0, Partial Supplementary European Search Report mailed Jan. 10, 2023", 12 pgs.
"The Authoritative Dictionary of IEEE Standards Terms", 7th ed. IEEE, Standards Information Network IEEE Press, [Online] Retrieved from the internet: <https://ieeexplore.ieee.org/stamp/stamp.jsp?arnumber=4116787>, (2000), 1003.
Madany, Waleed, et al., "An Enhanced PAM With PPM Modulation Interface For Memory Applications", 4 pgs.
"Korean Application Serial No. 10-2021-7030514, Response filed Feb. 13, 2024 to Notice of Preliminary Rejection mailed Nov. 10, 2023", with English claims, 22 pages.
"European Application Serial No. 20911114.5, Extended European Search Report mailed Jan. 18, 2024", 9 pgs.

\* cited by examiner

NEUROMORPHIC MEMORY DEVICE AND METHOD

CLAIM OF PRIORITY

This patent application claims the benefit of priority, under 35 U.S.C. § 119(e), to U.S. Provisional Patent Application Ser. No. 62/954,186, entitled "NEUROMORPHIC MEMORY DEVICE AND METHOD," filed on Dec. 27, 2019, which is hereby incorporated by reference herein in its entirety.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

It is desirable to provide improved main memory, such as DRAM memory. Features of improved main memory that are desired include, but are not limited to, higher capacity, higher speed, and reduced cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1A:
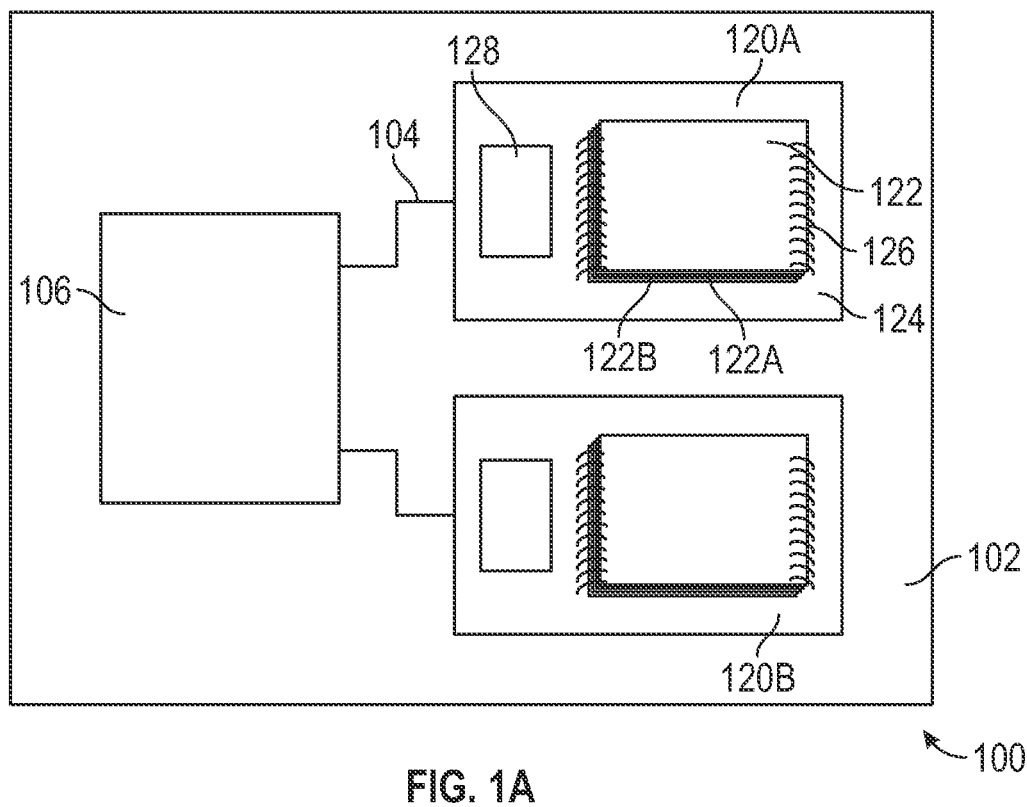
FIG. 1A illustrates a system including a memory device in accordance with some example embodiments.

FIG. 1A shows an electronic system 100, having a processor 106 coupled to a substrate 102. In some examples substrate 102 can be a system motherboard, or in other examples, substrate 102 may couple to another substrate, such as a motherboard. Electronic system, 100 also includes first and second memory devices 120A, 120B. Memory devices 120A, 120B are also shown supported by substrate 102 adjacent to the processor 106 but are depicted, in an example configuration, coupled to a secondary substrate 124. In other examples, memory devices 120A, 120B can be coupled directly to the same substrate 102 as processor 106.

The memory devices 120A, 120B, each include a controller die 128 that includes a buffer circuit, coupled to a secondary substrate 124. The memory devices 120A, 120B each include a respective stack of memory devices 122. For purposes of the present description, the stacked memory devices will be described in as one example configuration in which the devices are dynamic random access memory (DRAM) dies 122A, 122B are each coupled to the secondary substrate 124. Other types of memory devices may be used in place of DRAM, including, for example FeRAM, phase change memory (PCM), 3D XPoint™ memory, NAND memory, or NOR memory, or a combination thereof. In some cases, a single memory device may include one or more memory die that uses a first memory technology (e.g., DRAM) and a second memory die that uses a second memory technology (e.g., SRAM, FeRAM, etc.) different from the first memory technology.

The stack of DRAM dies 122 are shown in block diagram form in FIG. 1A. Other figures in the following description show greater detail of the stack of dies and various stacking configurations. In the example of FIG. 1A, a number of wire bonds 126 are shown coupled to the stack of DRAM dies 122. Additional circuitry (not shown) is included on or within the substrate 124. The additional circuitry completes the connection between the stack of DRAM dies 122, through the wire bonds 126, to the buffer die 120. Selected examples may include through silicon vias (TSVs) instead of wire bonds 126 as will be described in more detail in subsequent figures.

Figure 1B:
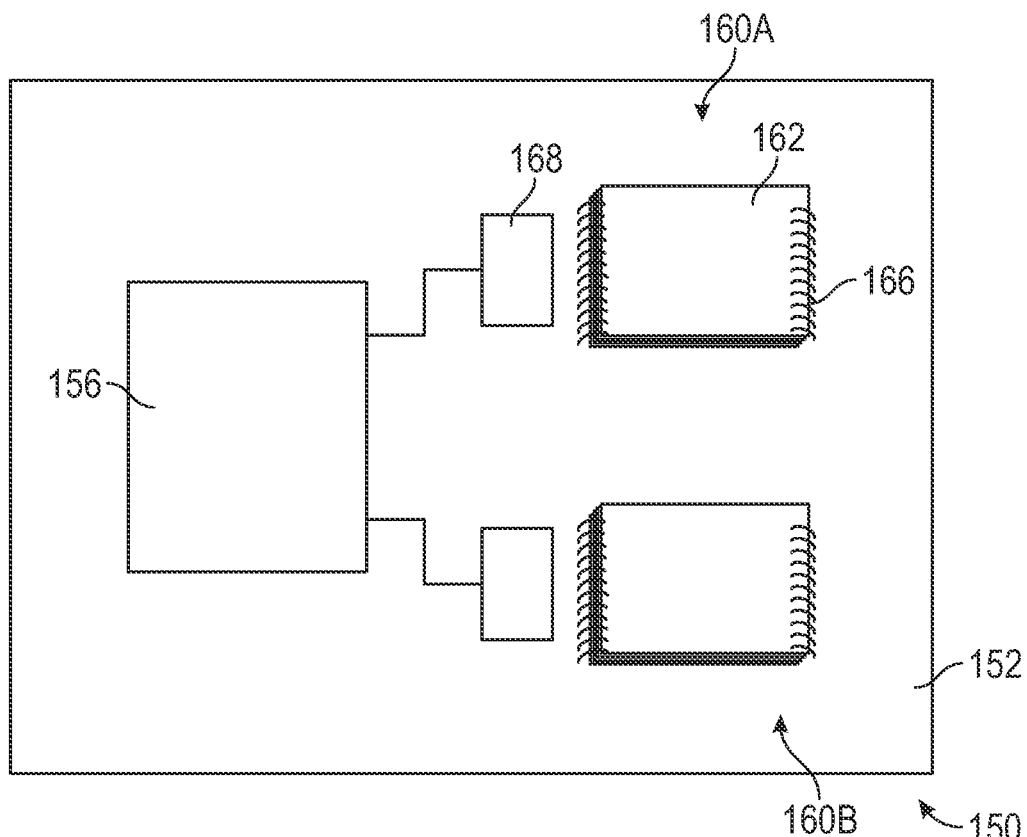
FIG. 1B illustrates another system including a memory device in accordance with some example embodiments.

Substrate wiring 104 is shown coupling the memory device 120A to the processor 106. In the example of FIG. 1B, an additional memory device 120B is shown. Although two memory devices 120A, 120B are shown for the depicted example, a, single memory structure may be used, or a number of memory devices greater than two may be used. Examples of memory devices as described in the present disclosure provide increased capacity near memory with increased speed and reduced manufacturing cost.

FIG. 1B shows an electronic system 150, having a processor 156 coupled to a substrate 152. The system 150 also includes first and second memory devices 160A, 160B. In contrast to FIG. 1A, in FIG. 1B, the first and second memory devices 160A, 160B are directly connected to the same substrate 102 as the processor 156, without any intermediary substrates or interposers. This configuration can provide additional speed and reduction in components over the example of FIG. 1A. Similar to the example of FIG. 1A, a controller die 168 including a buffer is shown adjacent to a stack of DRAM dies 162. Wire bonds 166 are shown as an example interconnection structure, however other interconnection structures such as TSVs may be used.

Figure 2:
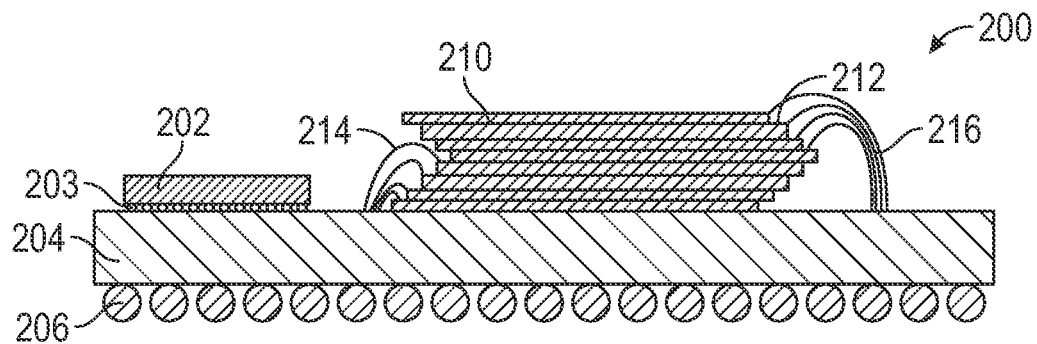
FIG. 2 illustrates an example memory system in accordance with some example embodiments.

FIG. 2 shows a memory system 200 similar to systems 120A, 120B from FIG. 1A, or systems 160A, 160B from FIG. 1B. The memory system 200 includes a controller die 202 coupled to a substrate 204. In one example, the controller die 202 includes a buffer, as described in examples above. The memory device 200 also includes a stack of DRAM dies 210 coupled to the substrate 204. In the example of FIG. 2, the individual dies in the stack of DRAM dies 210 are laterally offset from one or more vertically adjacent die specifically, in the depicted example, each die is laterally offset from both vertically adjacent die. As an example, the die may be staggered in at least one stair step configuration. The Example of FIG. 2 shows two different stagger directions in the stair stepped stack of DRAM dies 210. In the illustrated dual stair step configuration, an exposed surface portion 212 of each die is used for a number of wire bond interconnections.

Multiple wire bond interconnections 214, 216 are shown from the dies in the stack of DRAM dies 210 to the substrate 204. Additional conductors (not shown) on or within the substrate 204 further couple the wire bond interconnections 214, 216 to the controller die 202. The controller die 202 is shown coupled to the substrate 204 using one or more solder interconnections 203, such as a solder ball array. A number of substrate solder interconnections 206 are further shown on a bottom side of the substrate 204 to further transmit signals and data from the controller die 202 into a substrate 102 and eventually to a processor 106 as shown in FIG. 1B.

Figure 3A:
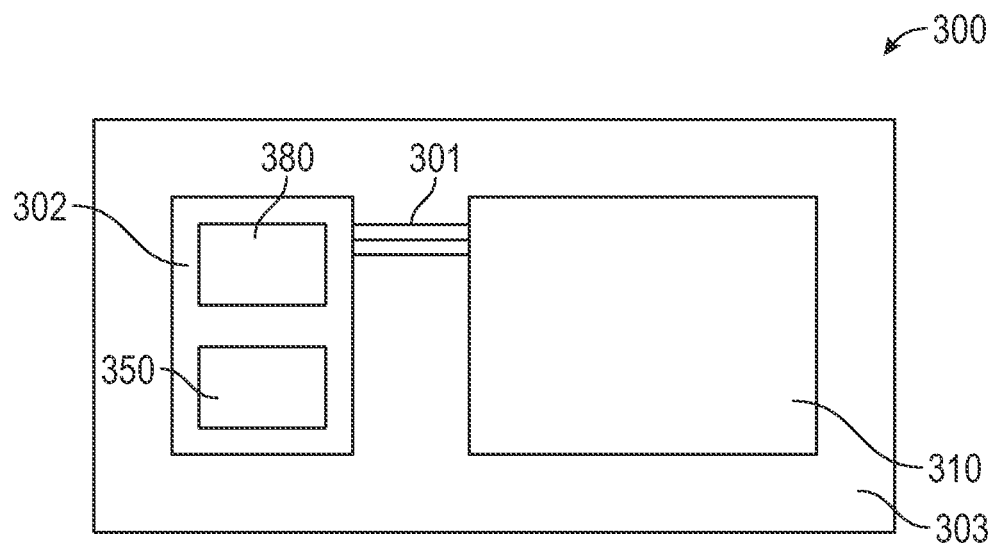
FIG. 3A illustrates a memory system in block diagram form in accordance with some example embodiments.

FIG. 3A shows a top view block diagram of a memory device 300 with a stack of memory dies 310. In one example, the stack of memory dies 310 includes DRAM dies. The stack of dies are shown coupled to a substrate 303. The stack of memory dies 310 are coupled to a controller die 302 through conductive traces 301. In the example of FIG. 3A, the controller die 302 includes a buffer 350 and a neuromorphic device 380. In one example, neuromorphic device is coupled between one or more dies in the stack of memory dies 310 and the buffer 350. It is desirable to perform computing operations, such as neuromorphic commuting operations, closer to the memory dies 310 where the data is stored. The close physical proximity of the neuromorphic device 380 to the memory dies 310 shortens a physical distance that data must travel in a computation. The shorter distance improves computing time, and reduces power needed to send data signals back and forth between a processor (for example processor 106 from FIG. 1) and memory dies in a memory device.

In the configuration shown in FIG. 3A the buffer 350 permits different data speeds between the controller die 302 and the stack of dies 310, as compared to a data speed between the controller die 302 and a host device, or processor, such as processor 106. This configuration may enhance the ability of the neuromorphic device to process large amounts of data without causing unwanted lags between the memory device 300 and the host device, or processor, such as processor 106. For example, a wider, slower data interface may be better suited to interact between the stack of memory dies 310 and the neuromorphic device 380, while a faster more narrow data interface may be better suited for interactions between the controller die 302 and the host device, or processor, such as processor 106. In one example, the buffer 350 of the controller die 302 performs this function. Examples of neuromorphic device structures are discussed in more detail below with regard to FIGS. 10 and 11.

Figure 3B:
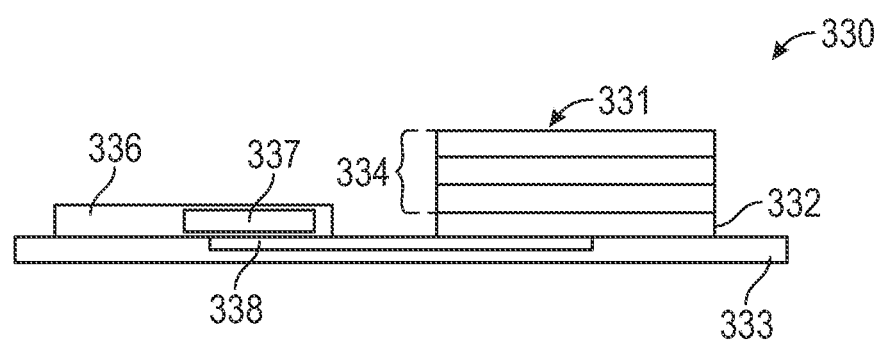
FIG. 3B illustrates another memory system in block diagram form in accordance with some example embodiments.

FIG. 3B shows a side view block diagram of a memory device 330 with a stack of dies 331. In one example, the stack of dies 331 includes DRAM dies. The stack of dies are shown coupled to a substrate 333. In the example of FIG. 3B, the stack of dies 331 includes memory dies 334 and at least one die 332 including one or more neuromorphic layer. The stack of memory dies 331 are coupled to a controller die 336 through conductive traces 338. In the example of FIG. 3B, the controller die 336 includes a buffer 337. The one or more neuromorphic layers of the die 332 are coupled between the memory dies 334 and the controller die 336. Similar to the operation of the memory device 300 from FIG. 3A, this configuration may enhance the ability of the one or more neuromorphic layers to process large amounts of data from the memory dies 334 with a wider and slower channel on one side of the buffer 337, while maintaining a faster more narrow interface between the memory device 330 and the host device, or processor, such as processor 106 on the other side of the buffer 337.

Two example locations of neuromorphic layers are shown in FIGS. 3A and 3B, however, the invention is not so limited. Other physical locations of neuromorphic layers are possible where the neuromorphic layers are located between one or more dies in a stack of memory dies and a host interface on a controller. Other possibilities include, but are not limited to a separate die from either a controller die or a stack of dies, where the separate die is located on a substrate such as substrate 303 or substrate 333.

Selected examples may include only a single neuromorphic layer. Other examples may include multiple neuromorphic layers. In one example multiple neuromorphic layers may include from 30 to 100 neuromorphic layers. Example devices such as image recognition systems for driverless vehicle navigation may utilize a number of layers in the range of 30-100. In one example a single die may include multiple neuromorphic layers. In one example, multiple dies may include multiple neuromorphic layers.

Figure 3C:
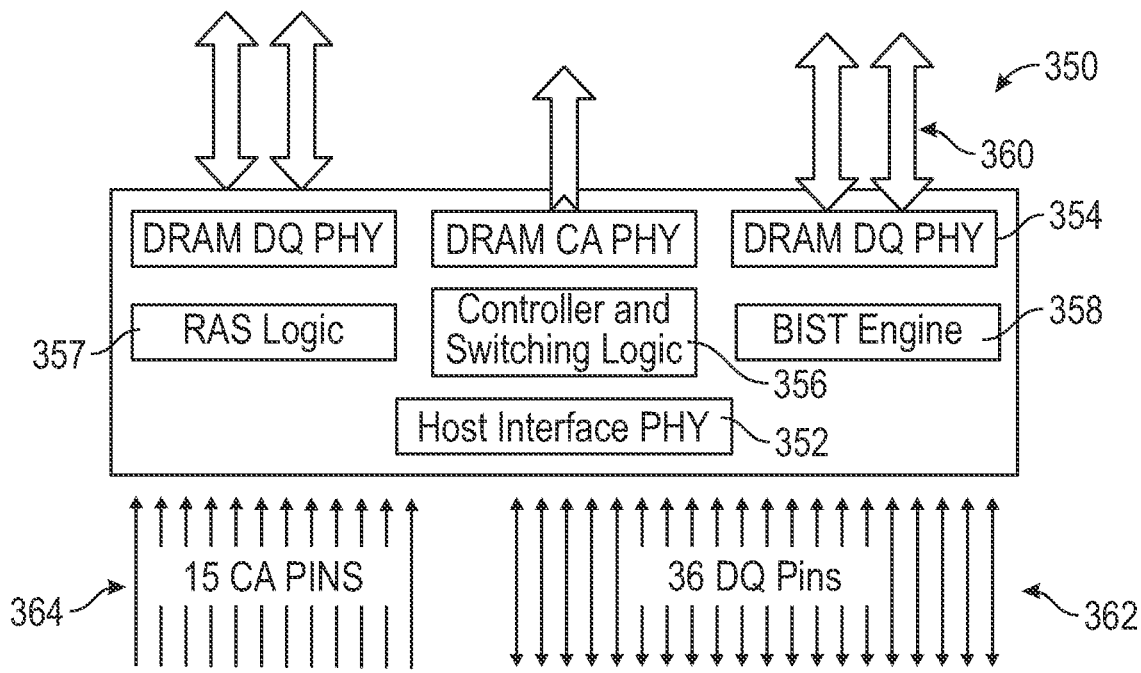
FIG. 3C illustrates a buffer die in block diagram form in accordance with some example embodiments.

FIG. 3C shows a block diagram of a buffer such as buffer 350 from FIG. 3A or buffer 337 from FIG. 3B. In one example, memory devices including a buffer as described in examples below better facilitate incorporation of local neuromorphic processing. For example the slower and wider interface 354 may be better suited to handling slower and wider data from a neuromorphic operation being performed between a stack of memory dies and the buffer. After a computed result from one or more neuromorphic layers is available, it can be transmitted through the buffer to the narrower, higher speed host interface such as interface 352 from FIG. 3C.

A host device interface 352 and a memory interface 354 are shown. Additional circuitry components of the buffer 350 may include a controller and switching logic 356, row address select (RAS) logic 357, and built in self-test (BIST) login 358. Communication from the buffer 350 to a stack of memory dies is indicated by arrows 360. Communication from the buffer 350 to a host device is indicated by arrows 362 and 364. If FIG. 3B, arrows 364 denote communication from command/address (CA) pins, and arrows 362 denote communication from data (DQ) pins. Example numbers of CA pins and DQ pins are provided only as examples, as the host device interface may have substantially greater or fewer of either or both CA and DQ pins. The number of pins of either type required may vary depending upon the width of the channel of the interface, the provision for additional bits (for example ECC bits), among many other variables. In many examples, the host device interface will be an industry standard memory interface (either expressly defined by a standard-setting organization, or a de facto standard adopted in the industry).

In one example, all CA pins 364 act as a single channel, and all data pins 362 act as a single channel. In one example, all CA pins 364 service all data pins 362. In another example, the CA pins 364 are subdivided into multiple sub-channels. In another example, the data pins 362 are subdivided into multiple sub-channels. One configuration may include a portion of the CA pins 364 servicing a portion of the data pins 362. In one specific example, 8 CA pins service 9 data pins as a sub-combination of CA pins and data pins. Multiple sub-combinations such as the 8 CA pin/9 data pin example, may be included in one memory device.

In operation, a possible data speed from a host device may be higher than interconnection components to memory dies such as trace lines, TSVs, wire bonds, etc. can handle. The addition of a buffer, such as buffer 350 from FIG. 3A, buffer 337 from FIG. 3B, or other form of buffer assembly, allows fast data interactions from a host device to be buffered. In the example of FIG. 3C, the host interface 352 is configured to operate at a first data speed. In one example, the first data speed may match the speed that the host device is capable of delivering.

In one example, the memory interface 354 is configured to operate at a second data speed, slower than the first data speed. In one example, the memory interface 534 is configured to be both slower and wider than the host interface 352. In operation, the buffer may translate high speed data interactions on the host interface 352 side into slower, wider data interactions on the memory interface 354 side. Additionally, as further described below, to maintain data throughput at least approximating that of the host interface, in some examples, the buffer can reallocate the connections of the host interface to multiple sub-channels associated with respective memory interfaces. The slower, and wider memory interface 354 may be configured to substantially match the capacity of the narrower, higher speed host interface 352. In this way, more limited interconnection components to memory dies such as trace lines, TSVs, wire bonds, etc. are able to handle the capacity of interactions supplied from the faster host device. Though one example host interface (with both CA pins and DQ pins) to buffer 350 is shown, buffer 350 may include multiple host interfaces for separate data paths that are each reallocated by buffer 350 to multiple DRAM interfaces, in a similar manner.

In one example, the host device interface 352 includes a first number of data paths, and the memory interface 354 includes a second number of data paths greater than the first number of data paths. In one example, circuitry in the buffer 352 maps data and commands from the first number of data paths to the second number of data paths. In such a configuration, the second number of data paths provide a slower and wider interface, as described above.

In one example the command/address pins 364 of the host device interface 352 include a first number of command/address paths, and on a corresponding memory interface 354 side of the buffer 350, the memory interface 354 includes a second number of command/address paths that is larger than the first number of command/address paths. In one example, the second number of command/address paths is twice the first number of command/address paths. In one example, the second number of command/address paths is more than twice the first number of command/address paths. In one example, the second number of command/address paths is four times the first number of command/address paths. In one example, the second number of command/address paths is eight times the first number of command/address paths.

In one example, a given command/address path on the memory interface 354 side of the buffer 352 is in communication with only a single DRAM die. In one example, a given command/address path on the memory interface 354 side of the buffer 350 is in communication with multiple DRAM dies. In one example, a given command/address path on the memory interface 354 side of the buffer 350 is in communication with 4 DRAM dies. In one example, a given command/address path on the memory interface 354 side of the buffer 350 is in communication with 16 DRAM dies.

In one example the data pins 362 of the host device interface 352 include a first number of data paths, and on a corresponding memory interface 354 side of the buffer 352, the memory interface 354 includes a second number of data paths that is larger than the first number of data paths. In one example, the second number of data paths is twice the first number of data paths. In one example, the second number of data paths is more than twice the first number of data paths. In one example, the second number of data paths is four times the first number of data paths. In one example, the second number of data paths is eight times the first number of data paths.

In one example, a data path on the memory interface 354 side of the buffer 350 is in communication with only a single DRAM die. In one example, a given data path on the memory interface 354 side of the buffer 350 is in communication with multiple DRAM dies. In one example, a given data path on the memory interface 354 side of the buffer 350 is in communication with 4 DRAM dies. In one example, a given data path on the memory interface 354 side of the buffer 350 is in communication with 16 DRAM dies.

In one example, the host interface 352 includes different speeds for command/address pins 364, and for data pins 362. In one example, data pins 362 of the host interface are configured to operate at 6.4 Gb/s. In one example, command/address pins 364 of the host interface are configured to operate at 3.2 Gb/s.

In one example, the memory interface 354 of the buffer 350 slows down and widens the communications from the host interface 352 side of the buffer 350. In one example, where a given command/address path from the host interface 352 is mapped to two command/address paths on the memory interface 354, a speed at the host interface is 3.2 Gb/s, and a speed at the memory interface 354 is 1.6 Gb/s.

In one example, where a given data path from the host interface 352 is mapped to two data paths on the memory interface 354, a speed at the host interface is 6.4 Gb/s, and a speed at the memory interface 354 is 3.2 Gb/s, where each data path is in communication with a single DRAM die in a stack of DRAM dies. In one example, where a given data path from the host interface 352 is mapped to four data paths on the memory interface 354, a speed at the host interface is 6.4 Gb/s, and a speed at the memory interface 354 is 1.6 Gb/s, where each data path is in communication with four DRAM dies in a stack of DRAM dies. In one example, where a given data path from the host interface 352 is mapped to eight data paths on the memory interface 354, a speed at the host interface is 6.4 Gb/s, and a speed at the memory interface 354 is 0.8 Gb/s, where each data path is in communication with 16 DRAM dies in a stack of DRAM dies.

In one example, a pulse amplitude modulation (PAM) protocol is used to communicate on the memory interface 354 side of the buffer 350. In one example, the PAM protocol includes PAM-4, although other PAM protocols are within the scope of the invention. In one example, the PAM protocol increases the data bandwidth. In one example, where a given data path from the host interface 352 is mapped to four data paths on the memory interface 354, a speed at the host interface is 6.4 Gb/s, and a speed at the memory interface 354 is 0.8 Gb/s using a PAM protocol, where each data path is in communication with four DRAM dies in a stack of DRAM dies. In one example, where a given data path from the host interface 352 is mapped to eight data paths on the memory interface 364, a speed at the host interface is 6.4 Gb/s, and a speed at the memory interface 354 is 0.4 Gb/s using a PAM protocol, where each data path is in communication with 16 DRAM dies in a stack of DRAM dies.

A number of pins needed to communicate between the buffer 350 and an example 16 DRAM dies varies depending on the number of command/address paths on the memory interface 354 side of the buffer 350, and on the number of DRAM dies coupled to each data path. The following table shows a number of non-limiting examples of pin counts and corresponding command/address path configurations.

| host CA paths | host speed (Gb/s) | DRAM CA paths | DRAM speed (Gb/s) | # dies coupled to DRAM path | # pins |
| --- | --- | --- | --- | --- | --- |
| 15 | 3.2 | 30 | 1.6 | 16 | 480 |
| 15 | 3.2 | 30 | 1.6 | 4 | 120 |
| 15 | 3.2 | 30 | 1.6 | 16 | 30 |
| 15 | 3.2 | 30 | 0.8 PAM-4 | 4 | 120 |
| 15 | 3.2 | 30 | 0.8 PAM-4 | 16 | 30 |

A number of pins needed to communicate between the buffer 350 and an example 16 DRAM dies varies depending on the number of data paths on the memory interface 354 side of the buffer 350, and on the number of DRAM dies coupled to each data path. The following table shows a number of non-limiting examples of pin counts and corresponding data path configurations.

| host data paths | host speed (Gb/s) | DRAM data paths | DRAM speed (Gb/s) | # dies coupled to DRAM path | # pins |
| --- | --- | --- | --- | --- | --- |
| 36 | 6.4 | 72 | 3.2 | 1 | 1152 |
| 36 | 6.4 | 144 | 1.6 | 4 | 576 |
| 36 | 6.4 | 288 | 0.8 | 16 | 288 |
| 36 | 6.4 | 144 | 0.8 PAM-4 | 4 | 576 |
| 36 | 6.4 | 288 | 0.4 PAM-4 | 16 | 288 |

As illustrated in selected examples below, the number of pins in the above tables may be coupled to the DRAM dies in the stack of DRAM dies in a number of different ways. In one example, wire bonds are used to couple from the pins to the number of DRAM dies. In one example, TSVs are used to couple from the pins to the number of DRAM dies. Although wire bonds and TSVs are used as an example, other communication pathways apart from wire bonds and TSVs are also within the scope of the invention.

Figure 4:
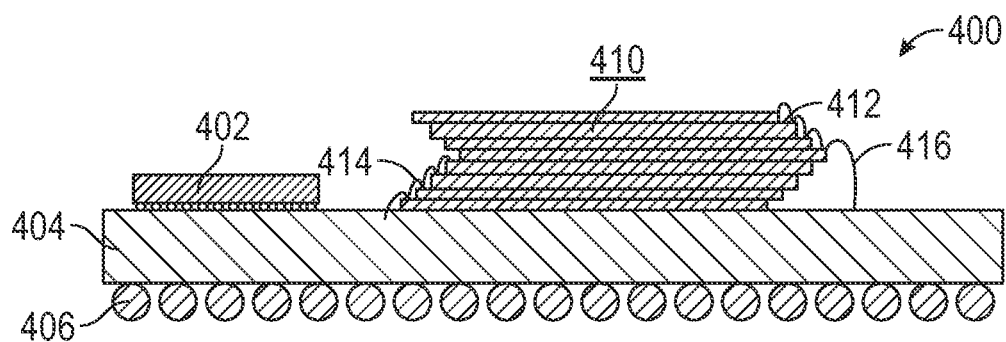
FIG. 4 illustrates another memory device in accordance with some example embodiments.

FIG. 4 shows another example of a memory device 400. The memory device 400 includes a controller die 402, including a buffer as described above, coupled to a substrate 404. The memory device 400 also includes a stack of DRAM dies 410 coupled to the substrate 404. In the example of FIG. 4, the stack of DRAM dies 410 are staggered in at least one stair step configuration. The Example of FIG. 4 shows two different stagger directions in the stair stepped stack of DRAM dies 410. Similar to the configuration of FIG. 2, in the illustrated stair step configuration, an exposed surface portion 412 is used for a number of wire bond interconnections.

Multiple wire bond interconnections 414, 416 are shown from the dies in the stack of DRAM dies 410 to the substrate 404. Additional conductors (not shown) on or within the substrate 404 further couple the wire bond interconnections 414, 416 to the controller die 402. The controller die 402 is shown coupled to the substrate 404 using one or more solder interconnections, such as a solder ball array. A number of substrate solder interconnections 406 are further shown on a bottom side of the substrate 404 to further transmit signals and data from the buffer die into a motherboard and eventually to a host device.

In the example of FIG. 4, the multiple wire bond interconnections 414, 416 are serially connected up the multiple stacked DRAM dies. In selected examples, a single wire bond may drive a load in more than one DRAM die. In such an example, the wire bond interconnections may be serially connected as shown in FIG. 4. In one example, a single wire bond may be serially connected to four DRAM dies. In one example, a single wire bond may be serially connected to eight DRAM dies. In one example, a single wire bond may be serially connected to sixteen DRAM dies. Other numbers of serially connected DRAM dies are also within the scope of the invention. Additionally, CA connections of the DRAM interface may be made to a first number of the DRAM dies, while the corresponding DQ connections of the DRAM interface may be made to a second number of the DRAM dies different from the first number.

Figure 5A:
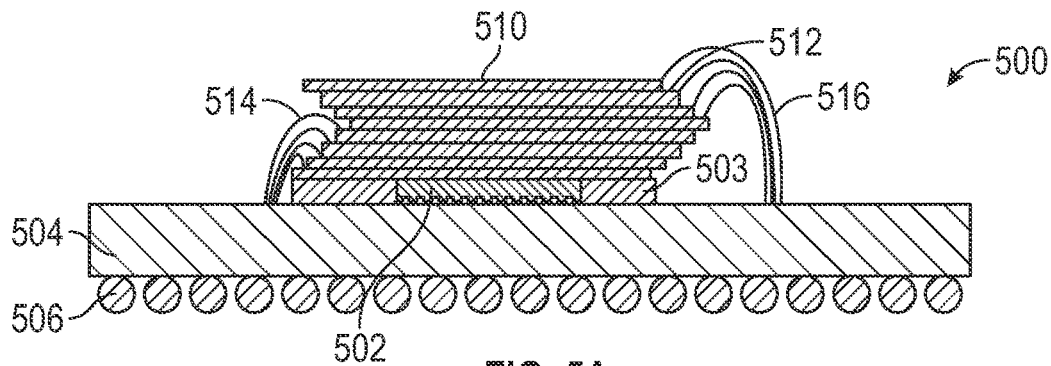
FIG. 5A illustrates another memory device in accordance with some example embodiments.

FIG. 5A shows another example of a memory device 500. The memory device 500 includes a controller die 502, including a buffer as described above, coupled to a substrate 504. The memory device 500 also includes a stack of DRAM dies 510 coupled to the substrate 504. In the example of FIG. 5A, the stack of DRAM dies 510 are staggered in at least one stair step configuration. The Example of FIG. 5 shows two different stagger directions in the stair stepped stack of DRAM dies 510. In the illustrated stair step configuration, an exposed surface portion 512 is used for a number of wire bond interconnections.

Multiple wire bond interconnections 514, 516 are shown from the dies in the stack of DRAM dies 410 to the substrate 404. Additional conductors (not shown) on or within the substrate 504 further couple the wire bond interconnections 514, 516 to the controller die 502. The controller die 502 is shown coupled to the substrate 504 using one or more solder interconnections, such as a solder ball array. A number of substrate solder interconnections 506 are further shown on a bottom side of the substrate 504 to further transmit signals and data from the buffer die into a motherboard and eventually to a host device.

In the example of FIG. 5A, the controller die 502 is located at least partially underneath the stack of DRAM dies 510. In one example, an encapsulant 503 at least partially surrounds the controller die 502. The example of FIG. 5A further reduces an areal footprint of the memory device 500. Further, an interconnect distance between the stack of DRAM dies 510 and the controller die 502 is reduced.

Figure 5B:
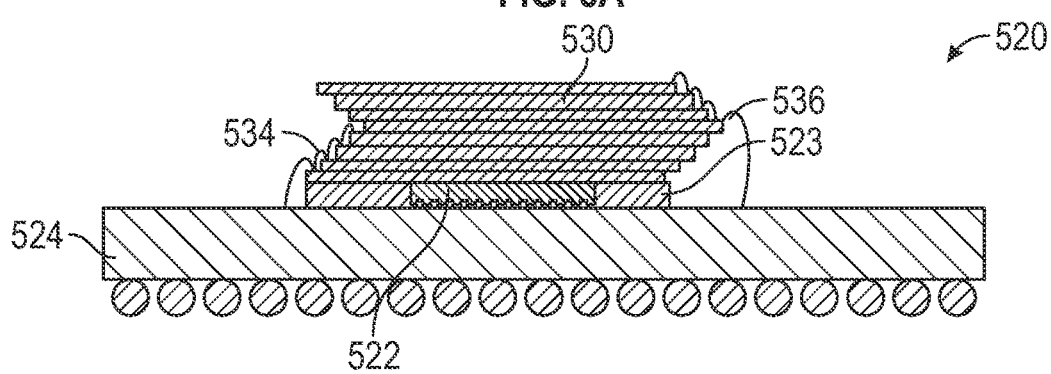
FIG. 5B illustrates another memory device in accordance with some example embodiments.

FIG. 5B shows another example of a memory device 520. The memory device 520 includes a controller die 522, including a buffer as described above, coupled to a substrate 524. The memory device 520 also includes a stack of DRAM dies 530 coupled to the substrate 524. Multiple wire bond interconnections 534, 536 are shown from the dies in the stack of DRAM dies 530 to the substrate 524. In the example of FIG. 5B, the multiple wire bond interconnections 534, 536 are serially connected up the multiple stacked DRAM dies. In one example, a single wire bond may be serially connected to four DRAM dies. In one example, a single wire bond may be serially connected to eight DRAM dies. In one example, a single wire bond may be serially connected to sixteen DRAM dies. Other numbers of serially connected DRAM dies are also within the scope of the invention.

Figure 5C:
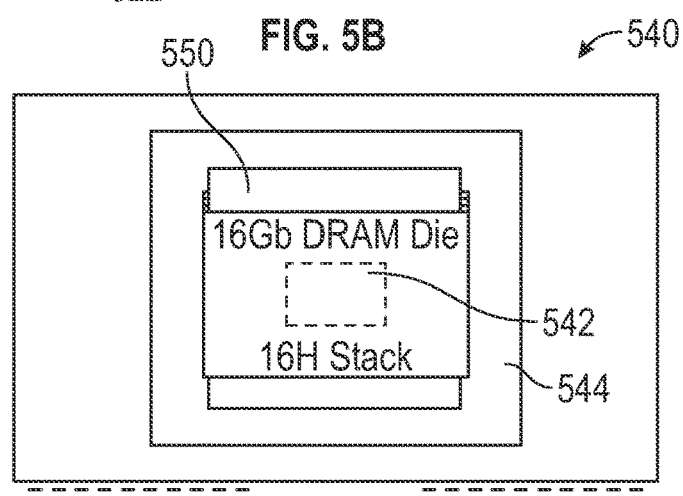
FIG. 5C illustrates another memory device in accordance with some example embodiments.
Figure 5D:
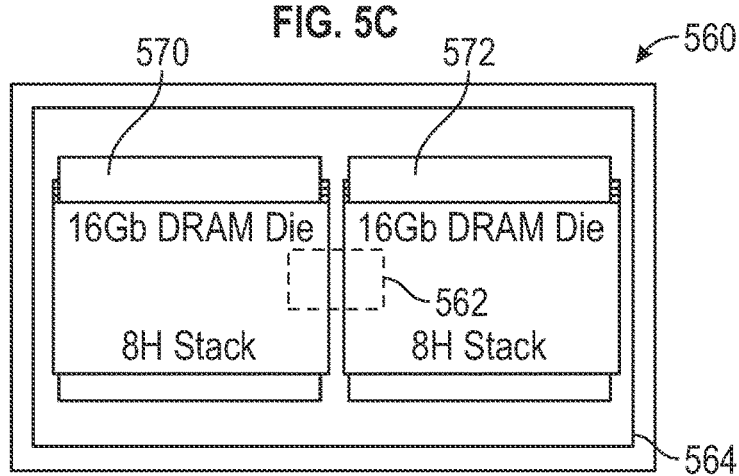
FIG. 5D illustrates another memory device in accordance with some example embodiments.

FIG. 5C shows a top view of a memory device 540 similar to memory devices 500 and 520. In the example of FIG. 5C, a controller die 542, including a buffer as described above, is shown coupled to a substrate 544, and located completely beneath a stack of DRAM dies 550. FIG. 5D shows a top view of a memory device 560 similar to memory devices 500 and 520. In FIG. 5D, a controller die 562 is coupled to a substrate 564, and located partially underneath a portion of a first stack of DRAM dies 570 and a second stack of DRAM dies 572. In one example, a shorter stack of DRAM dies provides a shorter interconnection path, and a higher manufacturing yield. In selected examples, it may be desirable to use multiple shorter stacks of DRAM dies for these reasons. One tradeoff of multiple shorter stacks of DRAM dies is a larger areal footprint of the memory device 560.

Figure 6:
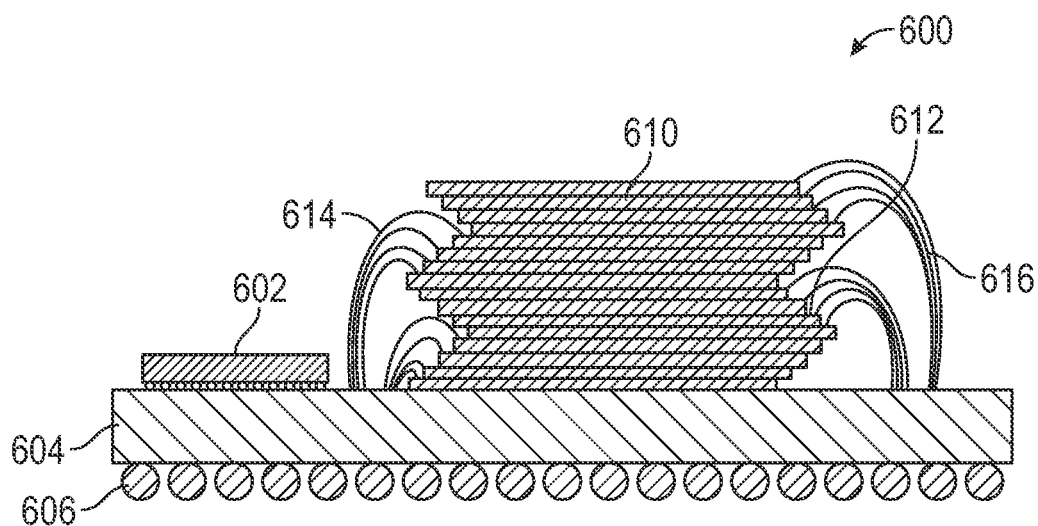
FIG. 6 illustrates another memory device in accordance with some example embodiments.

FIG. 6 shows another example of a memory device 600. The memory device 600 includes a controller die 602, including a buffer as described above, coupled to a substrate 604. The memory device 600 also includes a stack of DRAM dies 610 coupled to the substrate 604. In the example of FIG. 6, the stack of DRAM dies 610 are staggered in at least one stair step configuration. The Example of FIG. 6 shows four staggers, in two different stagger directions in the stair stepped stack of DRAM dies 610. The stack of DRAM dies 610 in FIG. 6 includes 16 DRAM dies, although the invention is not so limited. Similar to other stair step configurations shown, in FIG. 6, an exposed surface portion 612 is used for a number of wire bond interconnections.

Multiple wire bond interconnections 614, 616 are shown from the dies in the stack of DRAM dies 610 to the substrate 604. Additional conductors (not shown) on or within the substrate 604 further couple the wire bond interconnections 614, 616 to the controller die 602. The controller die 602 is shown coupled to the substrate 604 using one or more solder interconnections, such as a solder ball array. A number of substrate solder interconnections 606 are further shown on a bottom side of the substrate 604 to further transmit signals and data from the controller die into a motherboard and eventually to a host device.

Figure 7:
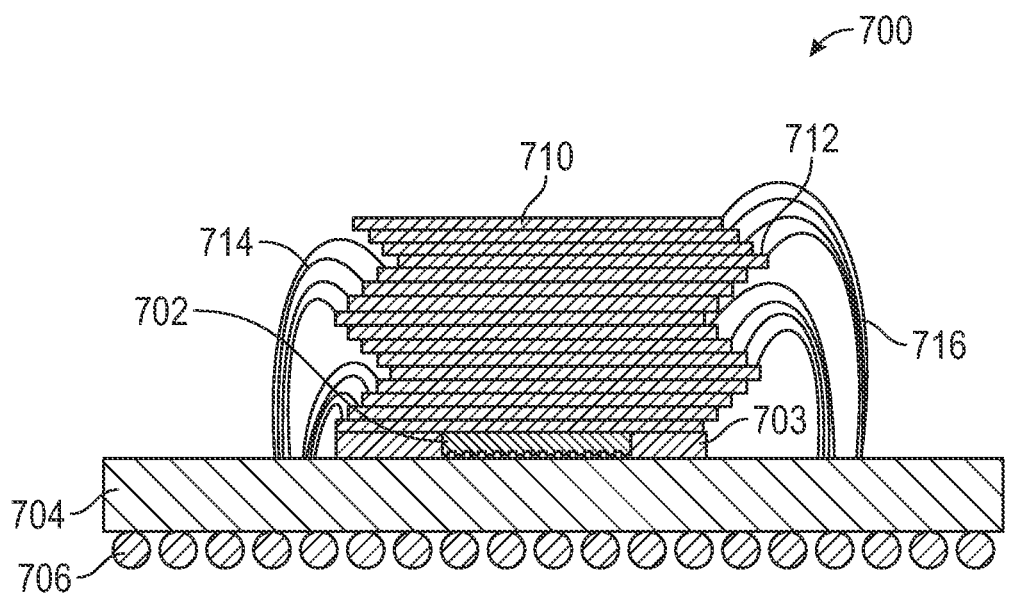
FIG. 7 illustrates another memory device in accordance with some example embodiments.

FIG. 7 shows another example of a memory device 700. The memory device 700 includes a controller die 702, including a buffer as described above, coupled to a substrate 704. The memory device 700 also includes a stack of DRAM dies 710 coupled to the substrate 704. In the example of FIG. 7, the stack of DRAM dies 710 are staggered in at least one stair step configuration. The Example of FIG. 7 shows four staggers, in two different stagger directions in the stair stepped stack of DRAM dies 710. The stack of DRAM dies 710 in FIG. 7 includes 16 DRAM dies, although the invention is not so limited. Similar to other stair step configurations shown, in FIG. 7, an exposed surface portion 712 is used for a number of wire bond interconnections.

Multiple wire bond interconnections 714, 716 are shown from the dies in the stack of DRAM dies 710 to the substrate 704. Additional conductors (not shown) on or within the substrate 704 further couple the wire bond interconnections 714, 716 to the controller die 702. The controller die 702 is shown coupled to the substrate 704 using one or more solder interconnections, such as a solder ball array. A number of substrate solder interconnections 706 are further shown on a bottom side of the substrate 704 to further transmit signals and data from the controller die into a motherboard and eventually to a host device.

In the example of FIG. 7, the controller die 702 is located at least partially underneath the stack of DRAM dies 710. In one example, an encapsulant 703 at least partially surrounds the controller die 702. The example of FIG. 7 further reduces an areal footprint of the memory device 700. Additionally, an interconnect distance between the stack of DRAM dies 710 and the controller die 702 is reduced.

Figure 8A:
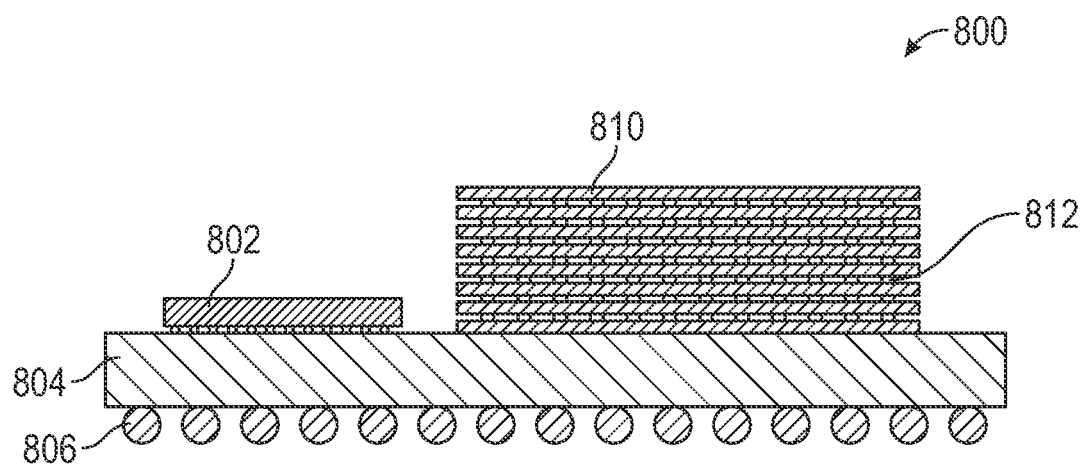
FIG. 8A illustrates another memory device in accordance with some example embodiments.

FIG. 8A shows another example of a memory device 800. The memory device 800 includes a controller die 802, including a buffer as described above, coupled to a substrate 804. The memory device 800 also includes a stack of DRAM dies 810 coupled to the substrate 804. In the example of FIG. 8A, the stack of DRAM dies 810 are vertically aligned. The stack of DRAM dies 810 in FIG. 8A includes 8 DRAM dies, although the invention is not so limited.

Multiple TSV interconnections 812 are shown passing through, and communicating with one or more dies in the stack of DRAM dies 810 to the substrate 804. Additional conductors (not shown) on or within the substrate 804 further couple the TSVs 812 to the controller die 802. The controller die 802 is shown coupled to the substrate 804 using one or more solder interconnections, such as a solder ball array. A number of substrate solder interconnections 806 are further shown on a bottom side of the substrate 804 to further transmit signals and data from the controller die into a motherboard and eventually to a host device.

Figure 8B:
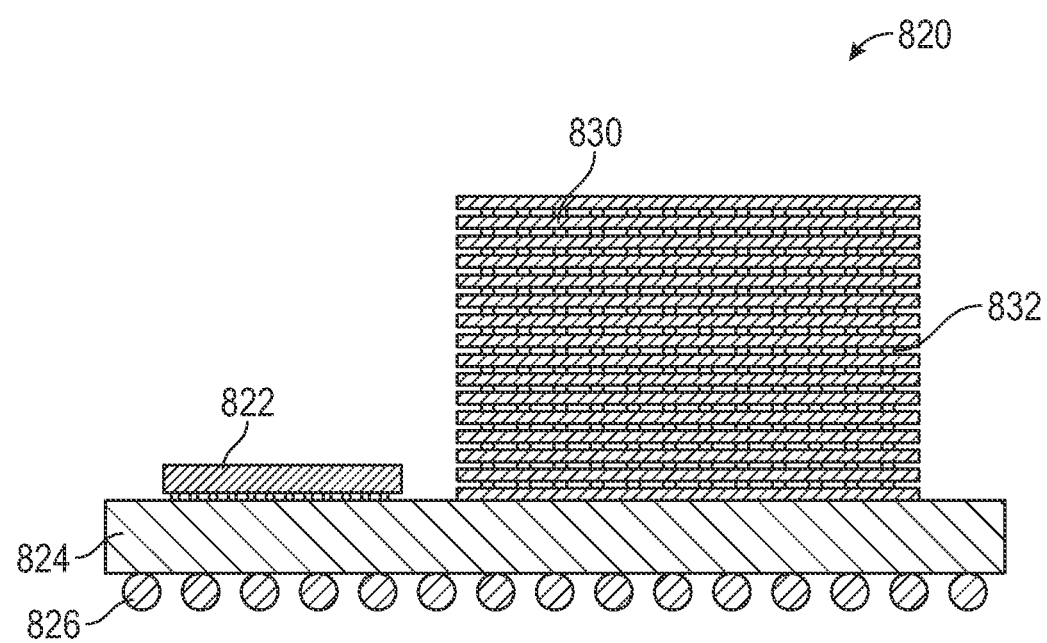
FIG. 8B illustrates another memory device in accordance with some example embodiments.

FIG. 8B shows another example of a memory device 820. The memory device 820 includes a controller die 822, including a buffer as described above, coupled to a substrate 824. The memory device 820 also includes a stack of DRAM dies 830 coupled to the substrate 824. In the example of FIG. 8B, the stack of DRAM dies 830 are vertically aligned. The stack of DRAM dies 830 in FIG. 8B includes 16 DRAM dies, although the invention is not so limited.

Multiple TSV interconnections 832 are shown passing through, and communicating with one or more dies in the stack of DRAM dies 830 to the substrate 824. Additional conductors (not shown) on or within the substrate 824 further couple the TSVs 832 to the controller die 822. The controller die 822 is shown coupled to the substrate 824 using one or more solder interconnections, such as a solder ball array. A number of substrate solder interconnections 826 are further shown on a bottom side of the substrate 824 to further transmit signals and data from the controller die into a motherboard and eventually to a host device.

Figure 9A:
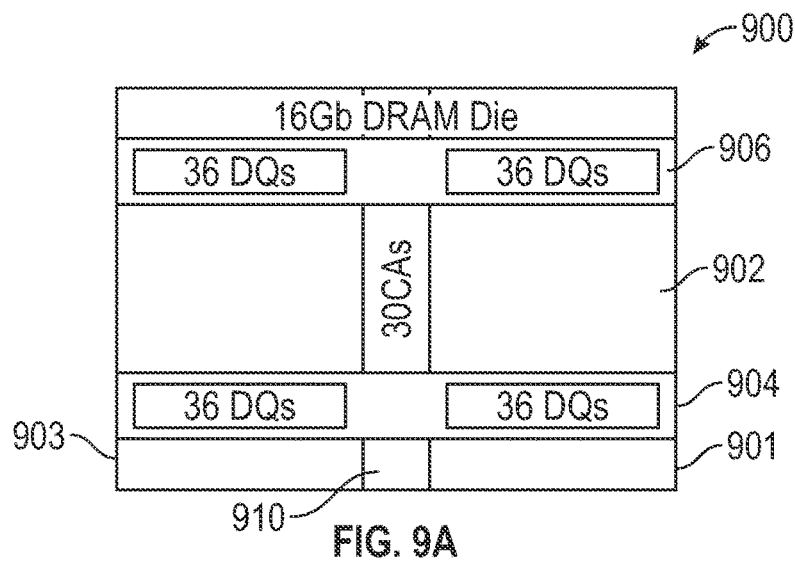
FIG. 9A illustrates a DRAM die configuration in accordance with some example embodiments.

FIG. 9A shows a block diagram of a single DRAM die 900 that may be included in a stack of memory dies according to any of the examples in the present disclosure. In FIG. 9A, the DRAM die 900 includes a storage region 902 that contains arrays of memory cells. A first data I/O stripe 904 is shown passing from a first side 901 to s second side 903 of the DRAM die 900. In one example, contacts may be formed on edges of the first data I/O stripe 904 on one or both sides 901, 903 of the first data I/O stripe 904. Contacts may be connected to wire bonds as described in examples above. In other examples, TSVs may be coupled to the first data I/O stripe 904, at sides 901, 903, or other locations along the first data I/O stripe 904.

A second data I/O stripe 906 is further shown in FIG. 9A. In one example, the second data I/O stripe 906 is substantially the same as the first data I/O stripe 904. In the example, of FIG. 9A, each data I/O stripe includes 36 contacts for connection to wire bonds on either side. With two data I/O stripes, and two sides each, the DRAM die 900 includes connections for 144 wire bonds or TSVs.

A command/address stripe 910 is further shown in FIG. 9A. In the example shown, the command/address stripe 910 includes 30 contacts for connection to wire bonds or TSVs. In one example, one or more of the DRAM dies may include a redistribution layer redistributing connections of one or more of the data I/O stripes 904, 906, 910 to a second location for wire bonding, such as to one or more rows of wire bond pads along an edge of the die (as depicted relative to the example wire bonded stack configurations discussed earlier herein).

Figure 9B:
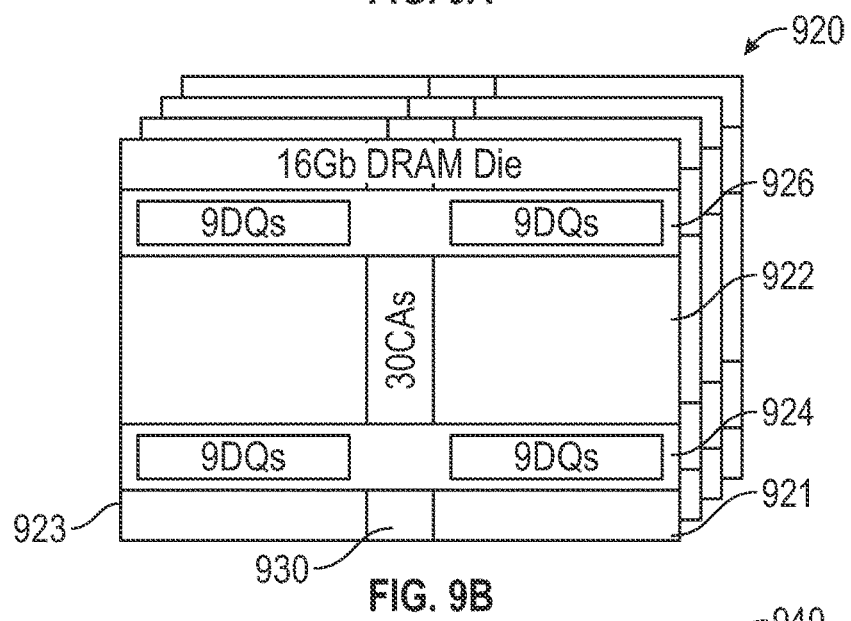
FIG. 9B illustrates another DRAM die configuration in accordance with some example embodiments.

FIG. 9B shows a block diagram of a stack of four DRAM dies 920 that may be included in a stack of DRAM dies according to any of the examples in the present disclosure. In FIG. 9B, each die in the stack 920 includes a storage region 922 that contains arrays of memory cells. A first data I/O stripe 924 is shown passing from a first side 921 to s second side 923 of the stack 920. In one example, contacts may be formed on edges of the first data I/O stripe 924 on one or both sides 921, 923 of the first data I/O stripe 924. Contacts may be connected to wire bonds as described in examples above. In other examples, TSVs may be coupled to the first data I/O stripe 924, at sides 921, 923, or other locations along the first data I/O stripe 924.

A second data I/O stripe 926 is further shown in FIG. 9B. In one example, the second data I/O stripe 926 is substantially the same as the first data I/O stripe 924. In the example, of FIG. 9B, each data I/O stripe includes 9 contacts for connection to wire bonds on either side. With two data I/O stripes, and two sides, each DRAM die in the stack 920 includes connections for 36 wire bonds or TSVs. In one example, all four of the dies in the stack 920 are driven by a single data path as described in examples above.

A command/address stripe 930 is further shown in FIG. 9B. In the example shown, the command/address stripe 930 includes 30 contacts for connection to wire bonds or TSVs.

Figure 9C:
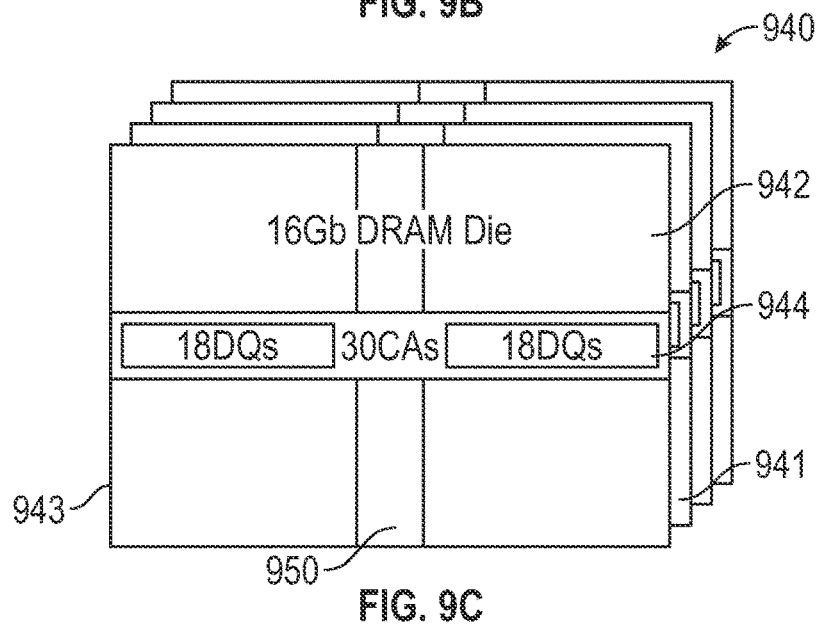
FIG. 9C illustrates another DRAM die configuration in accordance with some example embodiments.

FIG. 9C shows a block diagram of a stack of four DRAM dies 940 that may be included in a stack of memory dies according to any of the examples in the present disclosure. In FIG. 9C, each die in the stack 940 includes a storage region 942 that contains arrays of memory cells. A single data I/O stripe 944 is shown passing from a first side 941 to s second side 943 of the stack 940. In one example, contacts may be formed on edges of the data I/O stripe 944 on one or both sides 941, 943 of the data I/O stripe 944. Contacts may be connected to wire bonds as described in examples above. In other examples, TSVs may be coupled to the data I/O stripe 944, at sides 941, 943, or other locations along the first data I/O stripe 944.

In the example, of FIG. 9C, the single data I/O stripe 944 includes 18 contacts for connection to wire bonds on either side. With two sides, each DRAM die in the stack 940 includes connections for 36 wire bonds or TSVs. In one example, all four of the dies in the stack 940 are driven by a single data path as described in examples above.

A command/address stripe 950 is further shown in FIG. 9B. In the example shown, the command/address stripe 950 includes 30 contacts for connection to wire bonds or TSVs.

In the example memory devices described above including FIGS. 4-8B, one or more neuromorphic layers are coupled between one or more dies in the stack of dies and a host interface of an associated controller die. As described above, a buffer better facilitates operation of the one or more neuromorphic layers. Several different locations of the one or more neuromorphic layers are possible in each configuration described. Example locations include locations within the controller die, within the stack of memory dies, or other locations that are along a transmission path between the stack of memory dies and a host interface of an associated controller die.

Figure 10:
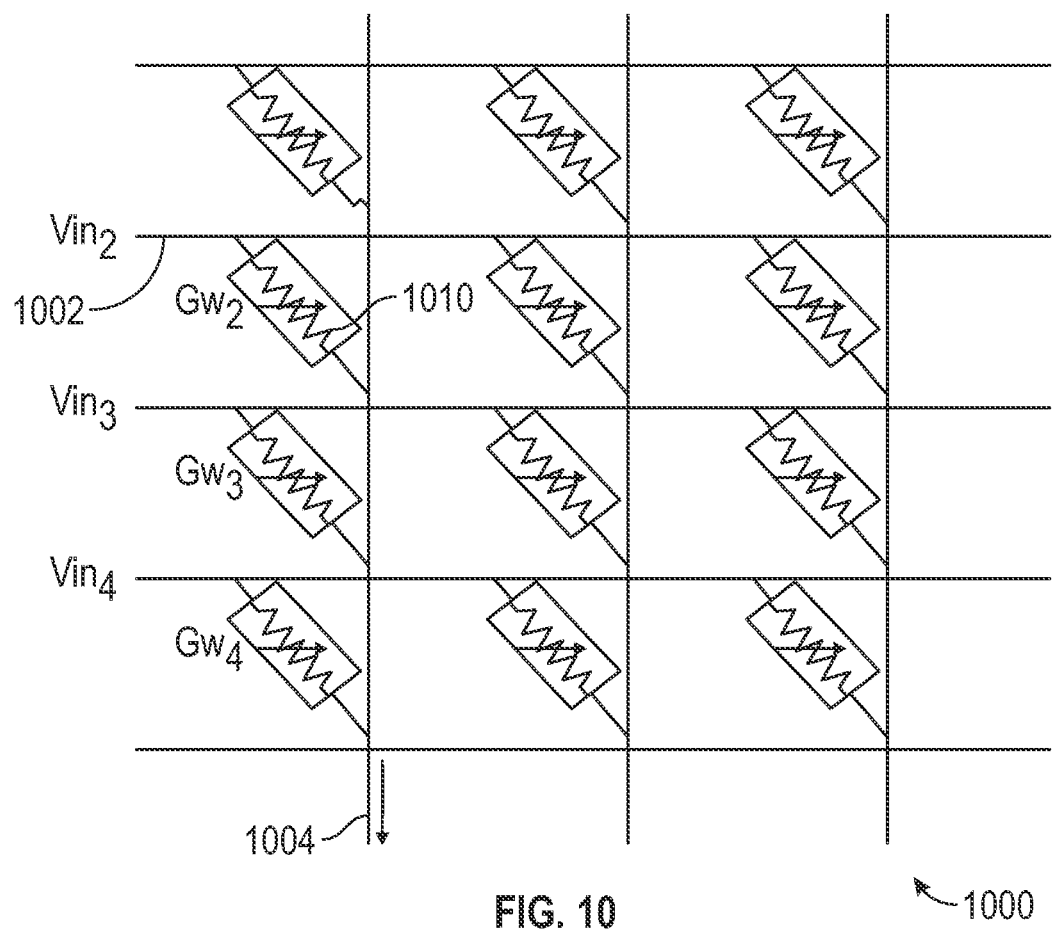
FIG. 10 illustrates an example neuromorphic layer in accordance with some example embodiments.

FIG. 10 shows an example architecture of a neuromorphic layer 1000 that may be one layer in a neuromorphic device according to one embodiment. The neuromorphic layer 1000 includes an array of input lines 1002 and an array of output lines 1004. A number of logical weighting devices 1010 are coupled between the array of input lines 1002 and the array of output lines 1004.

Examples of logical weighting devices 1010 may include analog weighting devices, digital weighting devices, or hybrid analog and digital weighting devices. Examples of logical weighting devices 1010 include, but are not limited to, memristors, ReRAM, phase change cells, multilayer storage devices, flash memory, etc. In one example, the logical weighting devices 1010 are capable of accumulating a logical weight that is representative of a variable number of inputs from the array of input lines 1002. As the logical weighting devices 1010 accumulate a weight, they are configured to transmit their relative weight to the array of output lines 1004. After a learning process, or a training process, the array of weighting devices 1010 is capable of recognizing a pattern.

In one example, a number of neuromorphic layers such as layer 1000 are logically coupled together to process information and pass information from a first layer to subsequent layers. A pattern of weights in individual cells in each successive layer yields a neuromorphically processed result. Examples of results include image recognition, such as for automated driving, or voice recognition.

Figure 11:
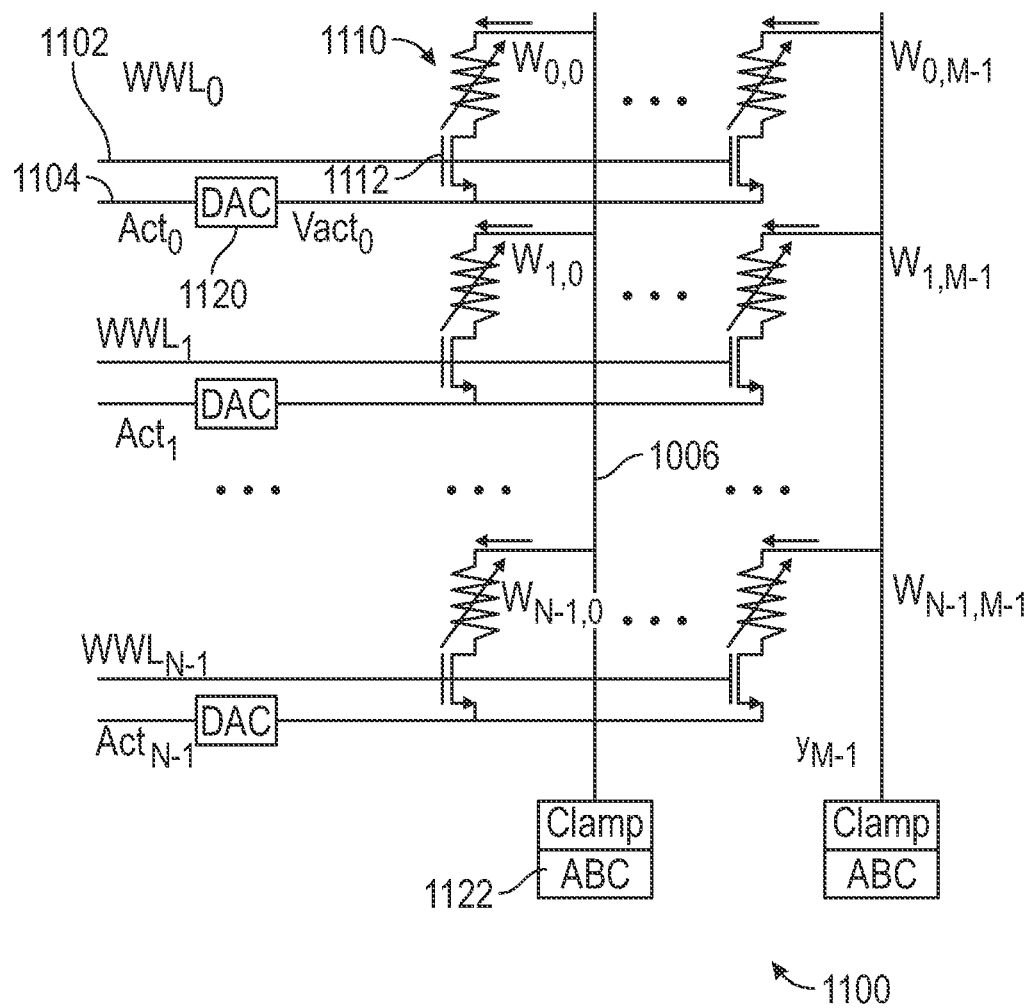
FIG. 11 illustrates another example neuromorphic layer in accordance with some example embodiments.

FIG. 11 shows an example of a hybrid digital and analog neuromorphic layer 1100 that may be one layer in a neuromorphic device according to one embodiment. An array of input lines 1104 and an array of output lines 1106 are shown. A number of logical weighting devices 1110 are coupled between the array of input lines 1104 and the array of output lines 1106. In the example of FIG. 11, a number of access devices 1112 are shown, along with an access line 1102 to selectively activate the access devices 1112. In one example, the access devices 1112 include transistors. Operation of the logical weighting devices 1110 is similar to the examples described in FIG. 10. Examples of logical weighting devices 1110 may include analog weighting devices, digital weighting devices, or hybrid analog and digital weighting devices. Examples of logical weighting devices 1110 include, but are not limited to, memristors, ReRAM, phase change cells, multilayer storage devices, flash memory, etc. As the logical weighting devices 1110 accumulate a weight, they are configured to transmit their relative weight to the array of output lines 1106. After a learning process, or a training process, the array of weighting devices 1110 is capable of recognizing a pattern.

In the example of FIG. 11, a number of digital to analog converters (DAC) 1120 are shown at an interface with the array of input lines 1104. A number of analog to digital converters (ADC) 1122 are further shown at an interface with the array of output lines 1106. In this way, a digital signal may arrive at a DAC 1120 and be converted in to an analog signal, The analog signal may be added to a weighting devices 1110 depending on the input. An analog signal, modified by the weighting device 1110 may them pass down an output line 1106, and be converted back to a respectively weighted digital signal at the ADC 1122.

Figure 12:
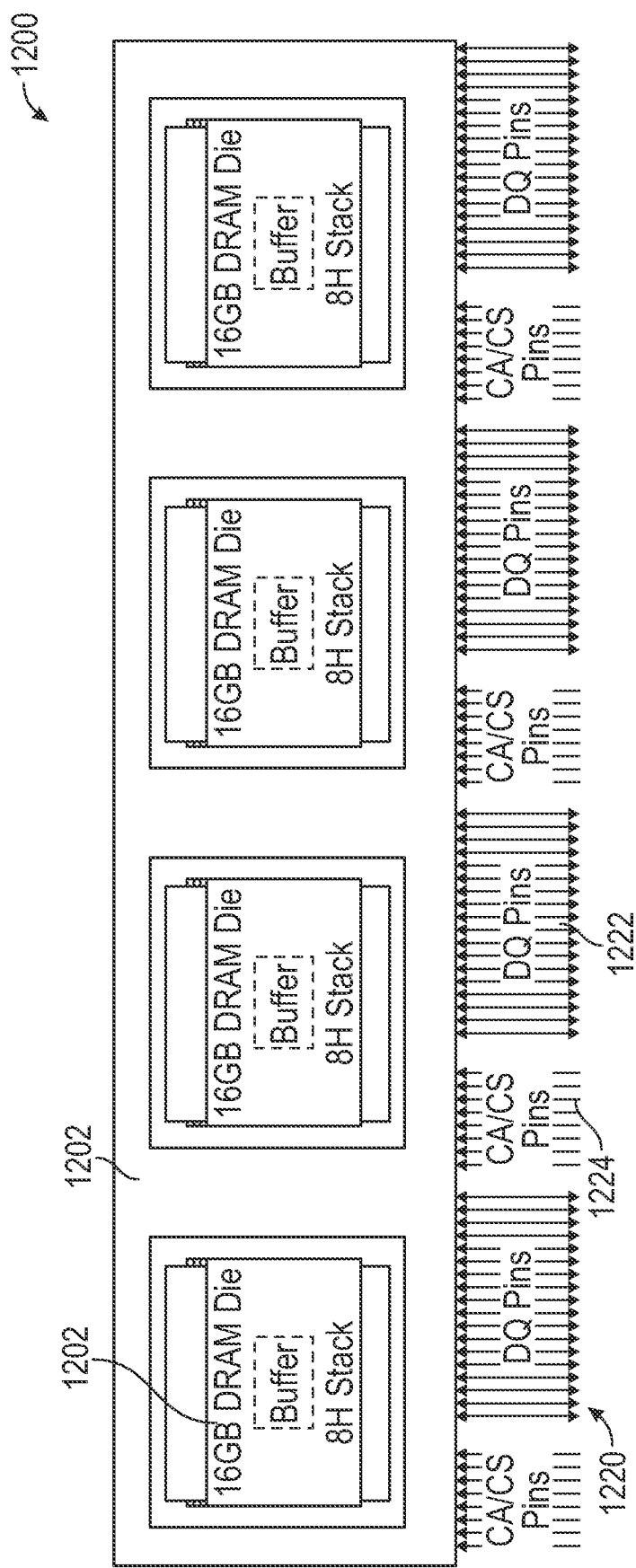
FIG. 12 illustrates a DIMM memory in accordance with some example embodiments.

FIG. 12 shows an example of a DIMM memory 1200 incorporating aspects of neuromorphic devices and buffers as described above. The DIMM memory 1200 includes a substrate 1202, and one or more memory devices 1210. In one example each memory device 1210 may include a stack of memory dies, a controller die, a buffer, and one or more neuromorphic layers as described in examples above. The DIMM memory 1200 further includes a number of pins 1220, that include CA/CS pins 1224 and DQ pins 1222 as described in example configurations above. It may be advantageous to use the commonly accepted industry format of a DIMM socket. In this way the advantages of local processing using one or more neuromorphic layers can be applied to existing memory formats to yield improved processing power and speed.

Figure 13:
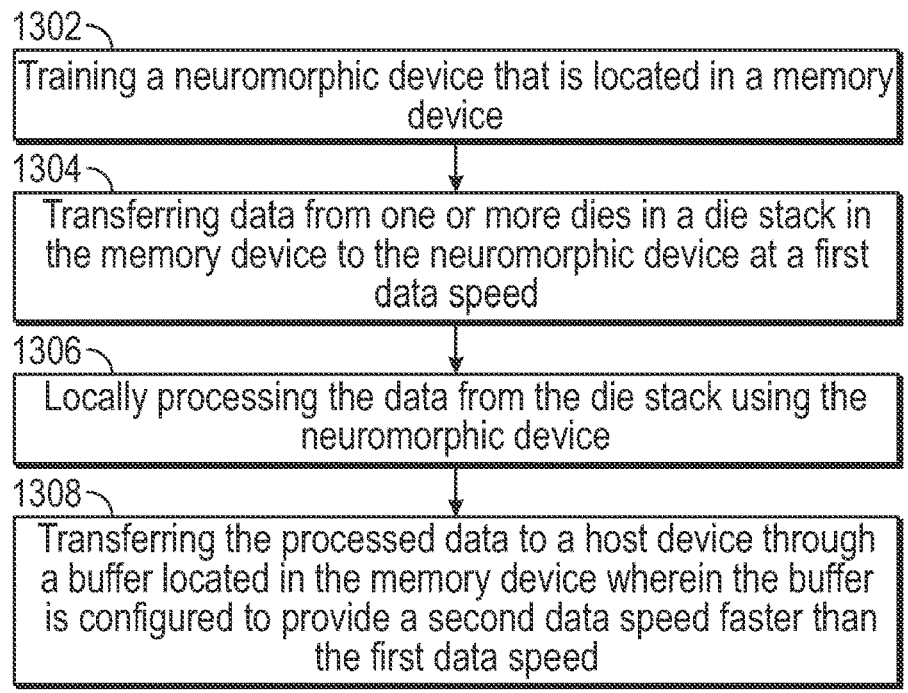
FIG. 13 illustrates a flow diagram of an example method in accordance with some example embodiments.

FIG. 13 shows a block diagram of one method of operation according to an embodiment of the invention. In operation 1302 a neuromorphic device that is located in a memory device is trained. Examples of training include, but are not limited to, using human input to provide a first line of recognition of basic image configuration components, or audio components, etc. The process of using an introductory level of human training makes computer recognition much more efficient and/or effective. One example of training includes verification programs used by the internet to check that a user is human. One example includes indicating which images include a fire hydrant, or a bus. The act of a human entering this input may be used to train a computer to more easily recognize objects such as a fire hydrant or a bus.

In operation 1304 data is transferred from one or more dies in a die stack in the memory device to the neuromorphic device at a first data speed. In operation 1306, the data from the die stack is locally processed using the neuromorphic device, and in operation 1308, the processed data is transferred to a host device through a buffer located in the memory device wherein the buffer is configured to provide a second data speed faster than the first data speed.

Figure 14:
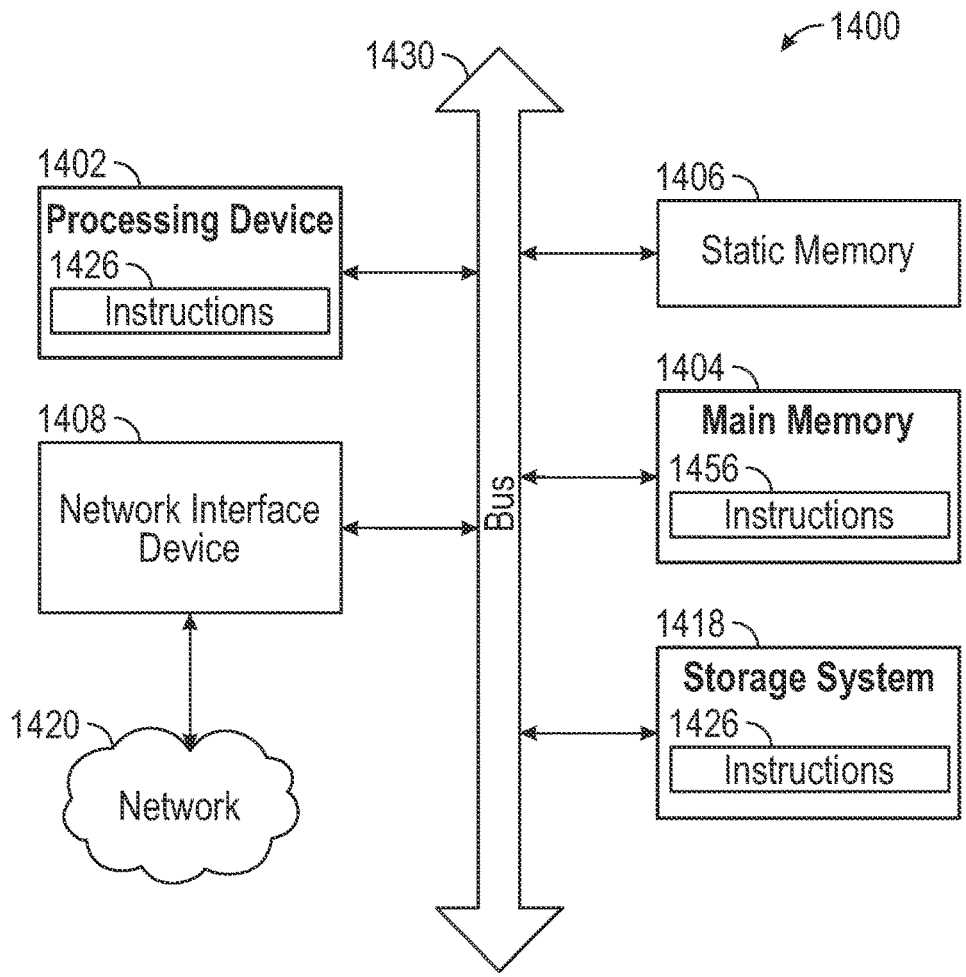
FIG. 14 illustrates an example block diagram of an information handling system in accordance with some example embodiments.

FIG. 14 illustrates a block diagram of an example machine (e.g., a host system) 1400 which may include one or more memory devices and/or systems as described above. In alternative embodiments, the machine 1400 may operate as a standalone device or may be connected (e.g., networked) to other machines. In a networked deployment, the machine 1400 may operate in the capacity of a server machine, a client machine, or both in server-client network environments. In an example, the machine 1400 may act as a peer machine in peer-to-peer (P2P) (or other distributed) network environment. The machine 1400 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 1400 may include a processing device 1402 (e.g., a hardware processor, a central processing unit (CPU), a graphics processing unit (GPU), a hardware processor core, or any combination thereof, etc.), a main memory 1404 (e.g., read-only memory (ROM), dynamic random-access memory (DRAM) such as synchronous DRAM (SDRAM) or Rambus DRAM (RDRAM), etc.), a static memory 1406 (e.g., static random-access memory (SRAM), etc.), and a storage system 1418, some or all of which may communicate with each other via a communication interface (e.g., a bus) 1430. In one example, the main memory 1404 includes one or more memory devices as described in examples above.

The processing device 1402 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1402 can also be one or more special-purpose processing devices such as an application specific integrated circuit (ASIC), a field programmable gate array (FPGA), a digital signal processor (DSP), network processor, or the like. The processing device 1402 can be configured to execute instructions 1426 for performing the operations and steps discussed herein. The computer system 1400 can further include a network interface device 1408 to communicate over a network 1420.

The storage system 1418 can include a machine-readable storage medium (also known as a computer-readable medium) on which is stored one or more sets of instructions 1426 or software embodying any one or more of the methodologies or functions described herein. The instructions 1426 can also reside, completely or at least partially, within the main memory 1404 or within the processing device 1402 during execution thereof by the computer system 1400, the main memory 1404 and the processing device 1402 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1400 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1400 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1426 (e.g., software, programs, an operating system (OS), etc.) or other data are stored on the storage system 1418 can be accessed by the main memory 1404 for use by the processing device 1402. The main memory 1404 (e.g., DRAM) is typically fast, but volatile, and thus a different type of storage than the storage system 1418 (e.g., an SSD), which is suitable for long-term storage, including while in an "off" condition. The instructions 1426 or data in use by a user or the machine 1400 are typically loaded in the main memory 1404 for use by the processing device 1402. When the main memory 1404 is full, virtual space from the storage system 1418 can be allocated to supplement the main memory 1404; however, because the storage system 1418 device is typically slower than the main memory 1404, and write speeds are typically at least twice as slow as read speeds, use of virtual memory can greatly reduce user experience due to storage system latency (in contrast to the main memory 1404, e.g., DRAM). Further, use of the storage system 1418 for virtual memory can greatly reduce the usable lifespan of the storage system 1418.

The instructions 1424 may further be transmitted or received over a network 1420 using a transmission medium via the network interface device 1408 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi, IEEE 802.16 family of standards known as WiMax®), IEEE 802.15.4 family of standards, peer-to-peer (P2P) networks, among others. In an example, the network interface device 1408 may include one or more physical jacks (e.g., Ethernet, coaxial, or phone jacks) or one or more antennas to connect to the network 1420. In an example, the network interface device 1408 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1400, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

To better illustrate the method and apparatuses disclosed herein, a non-limiting list of embodiments is provided here:

Example 1 is a memory system. The memory system includes a controller die coupled to a substrate, the controller die including a buffer, the buffer including a host interface and a die stack interface, wherein the host interface includes at least one channel, and the die stack interface includes two or more sub-channels. The memory system includes a stack of dies supported by the substrate and coupled to the two or more sub-channels. The memory system includes control logic reallocating the connections for the at least one channel to at least two sub-channels, and one or more neuromorphic layers logically coupled between one or more dies in the stack of dies and the host interface.

In Example 2, the subject matter of Example 1 is optionally configured such that the one or more neuromorphic layers are physically located within the controller die.

In Example 3, the subject matter of any of Examples 1-2 is optionally configured such that the buffer is configured to control data speed to the one or more neuromorphic layers.

In Example 4, the subject matter of any of Examples 1-3 is optionally configured to further include circuitry in the controller die, configured to operate the host interface at a first data speed, and to operate the die stack interface at a second data speed, slower than the first data speed.

In Example 5, the subject matter of any of Examples 1-4 is optionally configured such that the one or more neuromorphic layers include digital neuromorphic layers.

In Example 6, the subject matter of any of Examples 1-5 is optionally configured such that the one or more neuromorphic layers include analog multiply accumulator (MAC) neuromorphic layers.

In Example 7, the subject matter of any of Examples 1-6 is optionally configured such that the one or more neuromorphic layers include both digital and analog portions.

In Example 8, the subject matter of any of Examples 1-7 is optionally configured such that the stack of dies include DRAM dies.

In Example 9, the subject matter of any of Examples 1-8 is optionally configured such that the one or more neuromorphic layers include phase change cells.

In Example 10, the subject matter of any of Examples 1-9 is optionally configured such that the one or more neuromorphic layers include memristor cells.

In Example 11, the subject matter of any of Examples 1-10 is optionally configured such that the substrate is a motherboard.

In Example 12, the subject matter of any of Examples 1-11 is optionally configured such that the substrate is a dual in line memory (DIMM) substrate.

In Example 13, the subject matter of any of Examples 1-12 is optionally configured such that the substrate is an intermediate substrate coupled to a motherboard.

Example 14 is a memory system. The memory system includes a controller die coupled to a substrate, the controller die including a buffer, the buffer including a host interface and a die stack interface, wherein the host interface includes at least one channel, and the die stack interface includes two or more sub-channels. The memory system includes a stack of dies supported by the substrate and coupled to the two or more sub-channels. The memory system includes control logic reallocating the connections for the at least one channel to at least two sub-channels, and one or more neuromorphic layers logically coupled between one or more dies in the stack of dies and the host interface, and logic in the controller die to program one or more neuromorphic weights into the one or more neuromorphic layers.

In Example 15, the subject matter of Example 14 is optionally configured such that the one or more neuromorphic layers are physically located within the controller die.

In Example 16, the subject matter of any of Examples 14-15 is optionally configured such that the buffer is configured to control data speed to the one or more neuromorphic layers.

In Example 17, the subject matter of any of Examples 14-16 is optionally configured to further include circuitry in the controller die, configured to operate the host interface at a first data speed, and to operate the die stack interface at a second data speed, slower than the first data speed.

In Example 18, the subject matter of any of Examples 14-17 is optionally configured such that the one or more neuromorphic layers includes multiple layers in a single die.

In Example 19, the subject matter of any of Examples 14-18 is optionally configured such that the one or more neuromorphic layers includes multiple layers in multiple dies.

In Example 20, the subject matter of any of Examples 14-19 is optionally configured such that the stack of dies supported by the substrate include one or more wirebond connections to the substrate.

In Example 21, the subject matter of any of Examples 14-20 is optionally configured such that the stack of dies supported by the substrate include one or more through silicon via (TSV) connections to the substrate.

In Example 22, the subject matter of any of Examples 14-21 is optionally configured such that the one or more neuromorphic layers includes from 30 to 100 neuromorphic layers.

In Example 23, the subject matter of any of Examples 14-22 is optionally configured such that multiple die stacks are included on a dual in line memory (DIMM) substrate.

In Example 24, the subject matter of any of Examples 14-23 is optionally configured such that each die stack in the multiple die stacks is associated with a separate controller die.

Example 25 is a method. The method includes training a neuromorphic device that is located in a memory device, transferring data from one or more dies in a die stack in the memory system to the neuromorphic device at a first data speed, locally processing the data from the die stack using the neuromorphic device, and transferring the processed data to a host device through a buffer located in the memory system wherein the buffer is configured to provide a second data speed faster than the first data speed.

In Example 26, the subject matter of Example 25 is optionally configured such that transferring data from one or more dies in a die stack in the memory system to the neuromorphic device includes transferring data from one or more dies to a neuromorphic device located within the die stack.

In Example 27, the subject matter of any of Examples 25-26 is optionally configured such that transferring data from one or more dies in a die stack in the memory system to the neuromorphic device includes transferring data from the one or more dies to a controller die that includes both the neuromorphic device and the buffer.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory system, comprising:
    a controller die coupled to a substrate, the controller die including a buffer, the buffer including a host interface and a die stack interface, wherein the host interface includes at least one channel, and the die stack interface includes two or more sub-channels;
    a stack of memory dies supported by the substrate and coupled to the two or more sub-channels, and circuitry in the controller die, configured to operate the host interface at a first data speed, and to operate the two or more sub-channels coupled to the stack of memory dies at a second data speed, slower than the first data speed;
    control logic reallocating the connections for the at least one channel to at least two sub-channels; and
    one or more neuromorphic layers logically coupled between one or more dies in the stack of dies and the host interface.

2. The memory system of claim 1, wherein the one or more neuromorphic layers are physically located within the controller die.

3. The memory system of claim 1, wherein the buffer is configured to control data speed to the one or more neuromorphic layers.

4. The memory system of claim 1, wherein the one or more neuromorphic layers include digital neuromorphic layers.

5. The memory system of claim 1, wherein the one or more neuromorphic layers include analog multiply accumulator (MAC) neuromorphic layers.

6. The memory system of claim 1, wherein the one or more neuromorphic layers include both digital and analog portions.

7. The memory system of claim 1, wherein the stack of memory dies include DRAM dies.

8. The memory system of claim 1, wherein the one or more neuromorphic layers include phase change cells.

9. The memory system of claim 1, wherein the one or more neuromorphic layers include memristor cells.

10. The memory system of claim 1, wherein the substrate is a motherboard.

11. The memory system of claim 1, wherein the substrate is a dual in line memory (DIMM) substrate.

12. The memory system of claim 1, wherein the substrate is an intermediate substrate coupled to a motherboard.

13. A memory system, comprising:
    a controller die coupled to a substrate, the controller die including a buffer, the buffer including a host interface and a die stack interface, wherein the host interface includes at least one channel, and the die stack interface includes two or more sub-channels;
    a stack of memory dies supported by the substrate and coupled to the two or more sub-channels, and circuitry in the controller die, configured to operate the host interface at a first data speed, and to operate the two or more sub-channels coupled to the stack of memory dies at a second data speed, slower than the first data speed;
    control logic reallocating the connections for the at least one channel to at least two sub-channels; and
    one or more neuromorphic layers logically coupled between one or more dies in the stack of dies and the host interface; and
    logic in the controller die to program one or more neuromorphic weights into the one or more neuromorphic layers.

14. The memory system of claim 13, wherein the one or more neuromorphic layers are physically located within the controller die.

15. The memory system of claim 13, wherein the buffer is configured to control data speed to the one or more neuromorphic layers.

16. The memory system of claim 13, wherein the one or more neuromorphic layers includes multiple layers in a single die.

17. The memory system of claim 13, wherein the one or more neuromorphic layers includes multiple layers in multiple dies.

18. The memory system of claim 13, wherein the stack of dies supported by the substrate include one or more wirebond connections to the substrate.

19. The memory system of claim 13, wherein the stack of dies supported by the substrate include one or more through silicon via (TSV) connections to the substrate.

20. The memory system of claim 13, wherein the one or more neuromorphic layers includes from 30 to 100 neuromorphic layers.

21. The memory system of claim 13, wherein multiple memory die stacks are included on a dual in line memory (DIMM) substrate.

22. The memory system of claim 21, wherein each memory die stack in the multiple die stacks is associated with a separate controller die.

23. A method, comprising
training a neuromorphic device that is located in a memory device;
transferring data from one or more memory dies in a die stack in the memory system to the neuromorphic device at a first data speed;
locally processing the data from the die stack using the neuromorphic device;
transferring the processed data to a host device through a buffer located in the memory system wherein the buffer is configured to provide a second data speed faster than the first data speed.

24. The method of claim 23, wherein transferring data from one or more memory dies in a die stack in the memory system to the neuromorphic device includes transferring data from one or more memory dies to a neuromorphic device located within the die stack.

25. The method of claim 23, wherein transferring data from one or more memory dies in a die stack in the memory system to the neuromorphic device includes transferring data from the one or more memory dies to a controller die that includes both the neuromorphic device and the buffer.

* * * * *